(12) United States Patent
Nguyen

(10) Patent No.: US 6,914,460 B1
(45) Date of Patent: *Jul. 5, 2005

(54) COUNTER-BASED CLOCK DOUBLER CIRCUITS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/719,830

(22) Filed: Nov. 20, 2003

Related U.S. Application Data

(63) Continuation-in-part of application No. 10/618,329, filed on Jul. 11, 2003.

(51) Int. Cl.[7] .............................................. H03B 19/00
(52) U.S. Cl. ........................ 327/122; 327/116; 377/47
(58) Field of Search ................ 327/113–117, 119–122, 327/172–176, 291–299; 377/47–48; 713/500–503

(56) References Cited

U.S. PATENT DOCUMENTS

| | | | |
|---|---|---|---|
| 3,952,253 A | 4/1976 | DeVolpi et al. | 327/160 |
| 4,017,719 A | 4/1977 | Kaplan et al. | 327/175 |
| 4,290,022 A | 9/1981 | Puckette | 327/241 |
| 5,109,395 A | 4/1992 | Tanaka | 327/175 |
| 5,744,992 A | 4/1998 | Baumann | 327/241 |
| 5,898,329 A | 4/1999 | Hopkins | 327/176 |
| 6,023,199 A | 2/2000 | Cheung | 332/109 |
| 6,259,283 B1 | 7/2001 | Nguyen | 327/122 |
| 6,285,226 B1 | 9/2001 | Nguyen | 327/175 |
| 6,351,756 B1 | 2/2002 | Taniyoshi | 708/103 |
| 6,426,660 B1 | 7/2002 | Ho et al. | 327/175 |

OTHER PUBLICATIONS

U.S. Appl. No. 10/460,031, filed Jun. 11, 2003, Nguyen.
U.S. Appl. No. 10/651,811, filed Aug. 29, 2003, Nguyen.
U.S. Appl. No. 10/696,226, filed Oct. 28, 2003, Nguyen.
U.S. Appl. No. 10/696,227, filed Oct. 28, 2003, Nguyen.

*Primary Examiner*—Minh Nguyen
(74) *Attorney, Agent, or Firm*—Lois D. Cartier

(57) ABSTRACT

Clock doubler circuits and methods use counters to define the positions of the output clock edges. A plurality of counters are each clocked by a count clock relatively much faster than the input clock. A first counter counts for one input clock period, and the counted value is stored. The stored value is divided by two to provide the number of counts in half of the input clock period. The divided value is provided to a second counter that counts from zero to the divided value. Thus, the second counter generates a pulse halfway through the input clock period. Other counters running at the same clock rate can be used to generate pulses at other times in the input clock cycle, as desired. The pulses from the counters are used to provide output clock edges at predetermined times during the input clock cycle.

31 Claims, 17 Drawing Sheets

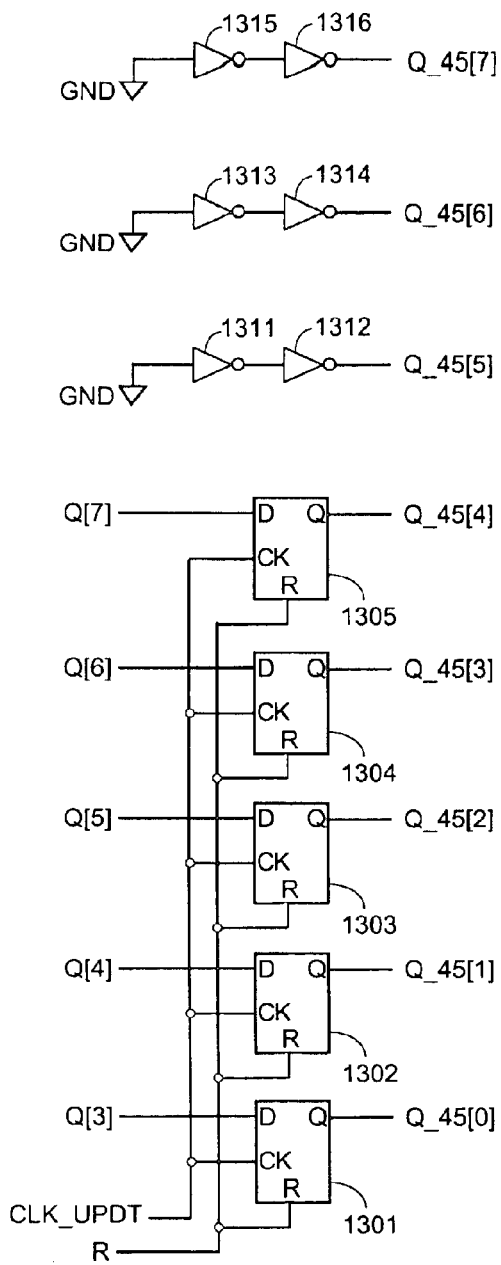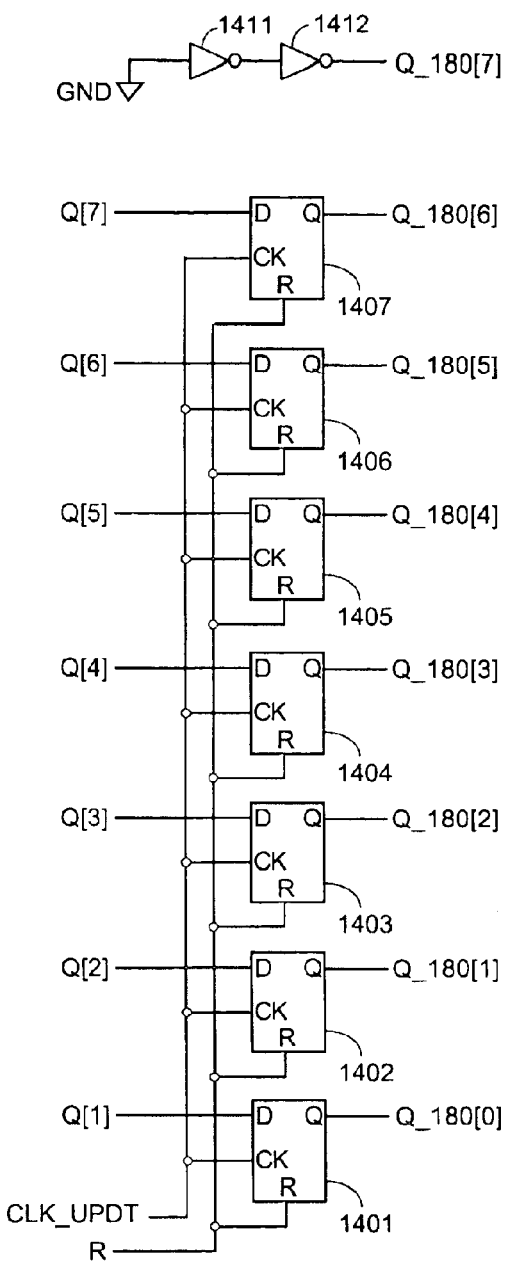
FIG. 13
FIG. 14

COUNTER-BASED CLOCK DOUBLER CIRCUITS AND METHODS

FIELD OF THE INVENTION

The invention relates to clock doubler circuits. More particularly, the invention relates to counter-based clock doubler circuits and methods optionally having duty cycle correction and offset capabilities.

BACKGROUND OF THE INVENTION

Clock signals are used in virtually every IC and electronic system to control timing. For example, every time a rising edge occurs on a clock signal, all the flip-flops in a circuit might change state. Clearly, the higher the frequency of the clock signal, the faster the circuit operates. Therefore, where performance is an issue, circuit designers usually prefer to use the fastest available clock that can be supported by the delays on the logic paths through the circuit. In other words, the performance of a circuit is, typically limited by the logic delays on the slowest logic path. However, sometimes the longest path delay through the circuit is significantly shorter than the period of the available clock, and the frequency of the available clock becomes the limiting factor.

To overcome this limitation, circuit designers can double the frequency of a clock signal using a phase-lock loop (PLL) or delay-lock loop (DLL) circuit. However, PLLs are analog in nature and take a long time to simulate, and a design that works in one manufacturing process may stop working when manufactured using another process. Therefore, PLLs are very difficult to design, and often are not feasible in a given circuit or system. DLLs can also be very complicated and difficult to design. Additionally, DLLS typically consume a great deal of silicon area. Therefore, clock doubling is often not feasible using known circuits and methods.

Therefore, it is desirable to provide circuits and methods that enable a circuit designer to double the frequency of an input clock without using a PLL or DLL, using a fairly simple circuit that consumes a relatively small amount of silicon area. Preferably, such circuits and methods can optionally be implemented using the logic resources included in a programmable logic device (PLD).

SUMMARY OF THE INVENTION

The invention provides clock doubler circuits and methods that use counters to define the desired positions of the output clock edges. A clock doubler circuit accepts an input clock signal and provides an output clock signal having a frequency twice that of the input clock signal. A clock doubler circuit according to an embodiment of the invention includes a plurality of counter circuits, each clocked by a count clock relatively much faster than the input clock signal. In some embodiments, each counter includes a small oscillator circuit implemented in the same fashion and generating a count clock for the counter. Thus, each counter uses a count clock having the same clock frequency.

A first counter is periodically enabled to count for one input clock period, and the counted value is stored in a register. Thus, the stored value represents the number of counts in one input clock period. The stored value is then divided (e.g., by two), the divided value representing the number of counts in a given fraction (e.g., half) of the input clock period. The divided value is then provided to a second counter that counts (for example) from zero to the divided value. Thus, the second counter generates a pulse at a predetermined time in the input clock period (e.g., halfway through the input clock period). Other counters running at the same clock rate can be used to generate pulses at other times in the input clock cycle, as desired. The pulses from the counters are used to provide output clock edges at predetermined times during the input clock cycle.

Some embodiments include a duty cycle correction feature, wherein the duty cycle of the output clock signal is independent of the duty cycle of the input clock signal. For example, the output clock signal can have a 50 percent duty cycle, or a 25 percent duty cycle. In some embodiments, the duty cycle correction feature can be enabled or disabled as desired.

Some embodiments include an offset feature to offset the predetermined times within the input clock period either forward or back (i.e., later or earlier) within the input clock period.

According to one embodiment, the invention provides a system that comprises a clock doubler circuit. The clock doubler circuit includes an input clock terminal, an output clock terminal, a first counter circuit, a register, a set counter circuit, a reset counter circuit, and an output clock generator. The first counter circuit has a clock terminal coupled to the input clock terminal and a plurality of output terminals. The register has a plurality of data input terminals coupled to the output terminals of the first counter circuit, a clock terminal coupled to the input clock terminal, and a plurality of output terminals. The set counter circuit has a clock terminal coupled to the input clock terminal, a plurality of data input terminals coupled to a first subset of the output terminals of the register, and an output terminal. The reset counter circuit has a clock terminal coupled to the output clock terminal of the set counter circuit, a plurality of data input terminals coupled to a second subset of the output terminals of the register, and an output terminal. Finally, the output clock generator has a first input terminal coupled to the input clock terminal, a set input terminal coupled to the output terminal of the set counter circuit, a reset input terminal coupled to the output terminal of the reset counter circuit, and an output terminal coupled to the output clock terminal.

Other embodiments of the invention provide methods of providing an output clock signal having a frequency twice that of an input clock signal. According to one embodiment, a method of providing from an input clock signal an output clock signal having a frequency twice that of the input clock signal includes: counting a first number of counts between successive first edges of the input clock signal; dividing the first number to provide a divided number; counting a second number of counts following each first edge of the input clock signal and comparing the second number with the divided number; providing a first pulse on the output clock signal in response to each first edge of the input clock signal; and providing a second pulse on the output clock signal based on results of comparing the second number with the divided number.

According to another embodiment, the invention provides a system that comprises a clock doubler circuit. The clock doubler circuit includes an input clock terminal, an output clock terminal, a first counter circuit, a divide-by-two register, a second counter circuit, and an output clock generator. The first counter circuit has a clock terminal coupled to the input clock terminal and a plurality of output terminals. The divide-by-two register has a plurality of data input terminals coupled to the output terminals of the first counter circuit, a clock terminal coupled to the input clock terminal, and a plurality of output terminals. The second counter circuit has a clock terminal coupled to the input clock terminal, a plurality of data input terminals coupled to the output terminals of the divide-by-two register, and a plurality of output terminals. Finally, the output clock generator has a plurality of input terminals coupled to the output terminals of the second counter circuit and an output terminal coupled to the output clock terminal of the clock doubler circuit.

According to yet another embodiment, a method of providing from an input clock signal an output clock signal having a frequency twice that of the input clock signal includes: counting a first number of counts between successive first edges of the input clock signal; dividing the first number to provide a divided number; counting a second number of counts following each first edge of the input clock signal and comparing the second number with the divided number; providing a first pulse on a first signal in response to each first edge of the input clock signal; providing a second pulse on a second signal based on results of comparing the second number with the divided number; and providing a pulse on the output clock signal whenever a pulse is provided on one of the first and second signals.

BRIEF DESCRIPTION OF THE DRAWINGS

The present invention is illustrated by way of example, and not by way of limitation, in the following figures.

FIG. 13 is a schematic diagram of a divide-by-eight register that can optionally be used in the embodiment of FIG. 11.

FIG. 14 is a schematic diagram of a divide-by-two register that can optionally be used in the embodiment of FIG. 11.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
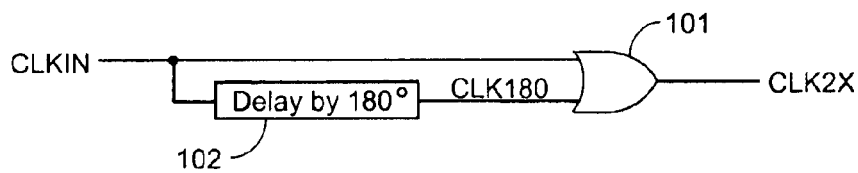
FIG. 1 illustrates a first prior art clock doubler circuit without duty cycle correction (DCC).

FIG. 1 illustrates a well known art clock doubler circuit without duty cycle correction (DCC). The clock doubler circuit of FIG. 1 has the advantages of being small and easy to implement, but also has several disadvantages. For example, the circuit of FIG. 1 functions correctly only when the input clock signal CLKIN has a duty cycle of less than 50 percent (e.g., the high value persists for less than half the length of the input clock cycle). Further, the circuit only provides a symmetrical output clock signal CLK2X for one input clock frequency.

The clock doubler circuit of FIG. 1 includes a logical OR gate 101 and a delay element 102 having a delay of half the input clock period. Logical OR gate 101 is driven by input clock signal CLKIN and by input clock signal CLKIN delayed by delay element 102, and provides output clock signal CLK2X. (In the present specification, the same reference characters are used to refer to terminals, signal lines, and their corresponding signals.)

When input clock signal CLKIN goes high, logical OR gate 101 drives output clock signal CLK2X high. Less than one-half clock period later, signal CLKIN goes low. Signal CLK180 (provided by delay element 102) is also still low. Therefore, logical OR gate 101 drives output clock signal CLK2X low. At the half-way point of the input clock period, signal CLK180 goes high, and logical OR gate 101 drives output clock signal CLK2X high again. Less than one-half clock period later, signal CLK180 goes low. Signal CLKIN is still low, so logical OR gate 101 drives output clock signal CLK2X low. Thus, signal CLK2X has twice the frequency of signal CLKIN. The length of the high pulse is unchanged from signal CLKIN, so the duty cycle of the output signal CLK2X is twice the duty cycle of the input signal CLKIN.

As previously noted, the circuit of FIG. 1 only provides a symmetrical output clock signal CLK2X for one input clock frequency. However, this frequency can be varied by changing the delay of delay element 102 to correspond to one-half of the input clock period, e.g., using programmable logic.

Figure 2:
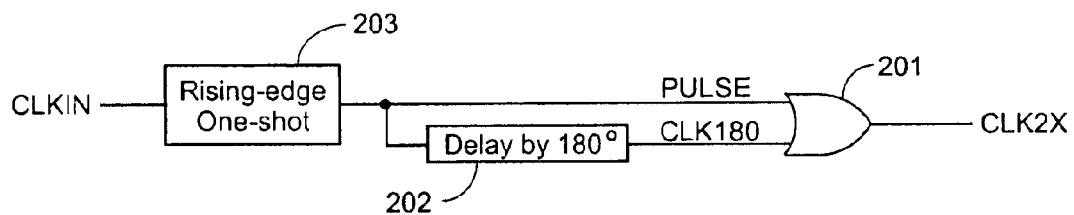
FIG. 2 illustrates a second prior art clock doubler circuit without DCC.

FIG. 2 illustrates another well known clock doubler circuit. The circuit of FIG. 2 provides an output duty cycle independent of that of the input clock signal, because the duty cycle of the output signal is controlled by an included one-shot. The circuit of FIG. 2 includes a logical OR gate 201, a delay element 202 having a delay of half the input clock period, and a rising-edge one-shot 203. One-shot 203 provides a pulse on signal PULSE whenever a rising edge occurs on input clock signal CLKIN. Logical OR gate 201 is driven by signal PULSE and by input clock signal CLKIN delayed by delay element 102, and provides output clock signal CLK2X.

When input clock signal CLKIN goes high, one-shot 203 provides a high value on signal PULSE. In response, logical OR gate 201 drives output clock signal CLK2X high. At the end of the high pulse from one-shot 203, signal PULSE goes low. Signal CLK180 (provided by delay element 102 from signal PULSE) is also still low. Therefore, logical OR gate 201 drives output clock signal CLK2X low. At the half-way point of the input clock period, signal CLK180 goes high, and logical OR gate 201 drives output clock signal CLK2X high again. At the end of the high pulse from delay element 202, signal CLK180 goes low. Signal CLKIN is still low, so logical OR gate 201 drives output clock signal CLK2X low. Thus, signal CLK2X has twice the frequency of signal CLKIN, and the duty cycle of signal CLK2X is determined by the length of the pulse generated by one-shot 203.

A pulse generated by a one-shot has a length that depends on process, power high level, and temperature. Therefore, the location of the falling edge of output signal CLK2X can vary with these factors. Further, the output pulse from one-shot 203 must be of sufficient duration to ensure a complete pulse regardless of these external factors, which can become a limiting factor to the frequency of input clock signal CLKIN.

As with the clock doubler circuit of FIG. 1, the clock doubler circuit of FIG. 2 is accurate for only one clock frequency. This frequency can be varied, however, if delay element 202 is programmable.

Figure 3:
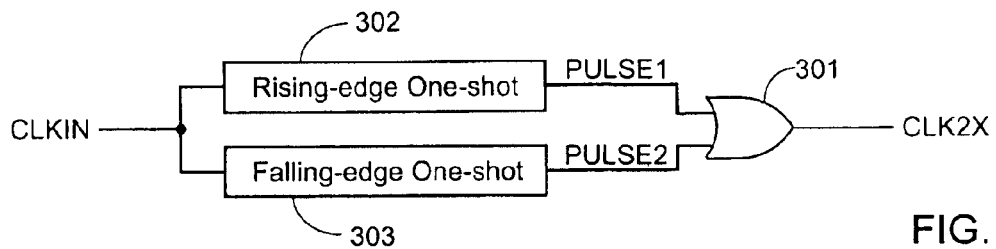
FIG. 3 illustrates a third prior art clock doubler circuit without DCC.

FIG. 3 shows a third well known clock doubler circuit that also does not provide DCC. In the circuit of FIG. 3, a rising-edge one-shot 302 provides a pulse on signal PULSE1 in response to each rising edge of input signal CLKIN, while a falling-edge one-shot 303 provides a pulse on signal PULSE2 in response to a falling edge on signal CLKIN. Thus, logical OR gate 301 provides a complete pulse on output clock signal CLK2X in response to each edge (both rising and falling) of signal CLKIN.

Because the circuit of FIG. 3 does not include a delay element tailored to the input clock frequency, the circuit can be used for various input clock frequencies. However, as in the circuit of FIG. 2, the one-shots can become limiting factors to the frequency of input clock signal CLKIN. Additionally, the circuit of FIG. 3 does not provide duty cycle correction, which is often a desirable feature in a clock doubler circuit. Further, the circuit of FIG. 3 only provides a symmetrical frequency on the output clock if the input clock signal has a 50 percent duty cycle.

Figure 4:
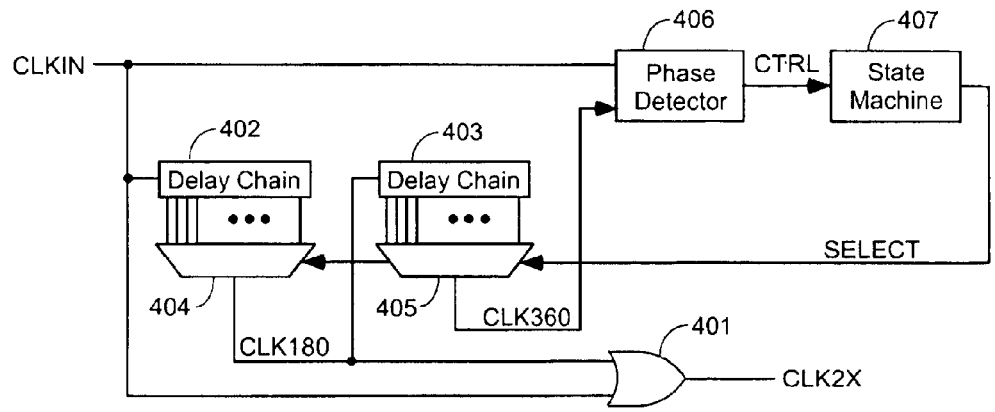
FIG. 4 illustrates a prior art clock doubler circuit that uses a DLL and does not provide DCC.

FIG. 4 illustrates a known clock doubler circuit that uses a DLL to generate output clock signal CLK2X. The clock doubler of FIG. 4 does not provide DCC, and requires an input clock signal having a duty cycle of less than 50 percent. The circuit of FIG. 4 actually corresponds to the circuit of FIG. 1, with delay element 102 being implemented using a DLL (including elements 402–407), and logical OR gate 401 corresponding to logical OR gate 101. However, the circuit of FIG. 4 has the advantage of supporting a range of input clock frequencies, rather than being tailored to support a single clock frequency.

The clock doubler of FIG. 4 includes logical OR gate 401, delay chains 402–403, clock multiplexers 404–405, phase detector 406, and state machine 407. Delay chains 402–403 and multiplexers 404–405 provide signals CLK180 and CLK360, respectively, delayed from signal CLKIN by one-half and one full clock cycle, respectively. (Note that as in the circuit of FIG. 1, the signal name CLK180 denotes a signal delayed by one-half clock period, i.e., 180 degrees, from input clock signal CLKIN.) Logical OR gate 401 is driven by input clock signal CLKIN and signal CLK180 from the DLL.

Signal CLK360 is provided to phase detector 406 along with input signal CLKIN, and phase detector 406 provides control signals CTRL (e.g., signals ADD and SUBTRACT, not shown) indicating a phase relationship between signals CLKIN and CLK360. State machine 407 receives control signals CTRL and provides SELECT signals that control clock multiplexers 404 and 405 to select appropriate clock signals CLK180 and CLK360. Thus, the DLL comprising elements 402–407 ensures the correct phase relationship between each signal CLK180, CLK360 and input clock signal CLKIN, and the clock doubler circuit is accurate over a range of input clock frequencies. The output clock signal CLK2X has twice the duty cycle of input clock signal CLKIN.

A significant disadvantage of the circuit of FIG. 4 is that implementing DLLS typically requires a large amount of circuitry.

The circuit of FIG. 4 can also be modified by adding a one-shot to the input clock path (see one-shot 203 of FIG. 2). The resulting clock doubler circuit supports input clock signals having duty cycles greater than 50 percent.

Figure 5:
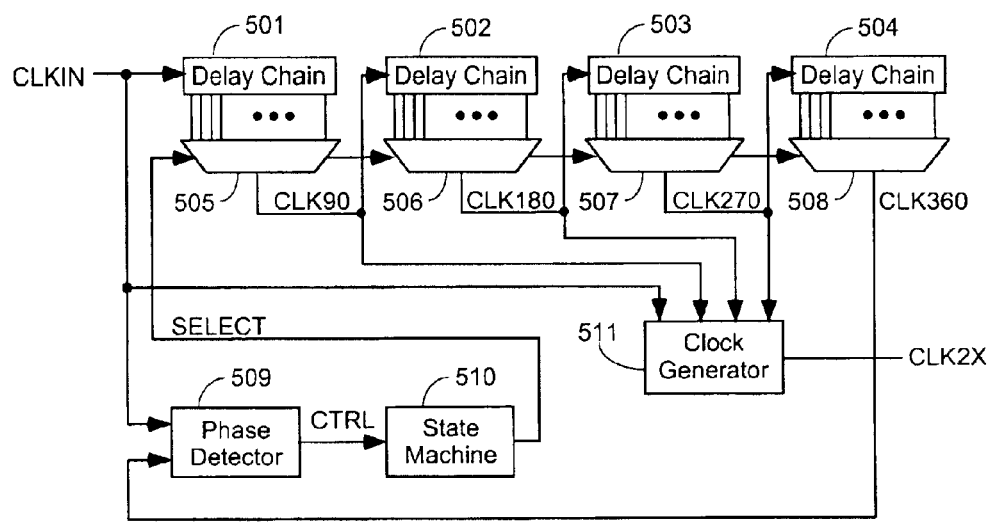
FIG. 5 illustrates a prior art clock doubler circuit that uses a DLL and provides DCC.

FIG. 5 illustrates another known clock doubler circuit that includes a DLL. The clock doubler of FIG. 5 supports a range of input clock frequencies, as in the clock doubler circuit of FIG. 4, but provides an output clock signal CLK2X having a 50 percent duty cycle.

The clock doubler of FIG. 5 includes clock generator 511, delay chains 501–504, clock multiplexers 505–508, phase detector 509, and state machine 510. Delay chains 501–504 and multiplexers 505–508 provide signals CLK90, CLK180, CLK270, and CLK360, respectively, delayed from signal CLKIN by one-quarter, one-half, three-quarters, and one full clock cycle, respectively. Clock generator 511 is driven by signals CLKIN, CLK90, CLK180, and CLK270, and provides output clock signal CLK2X.

Signal CLK360 is provided to phase detector 509 along with input signal CLKIN, and phase detector 509 provides control signals CTRL (e.g., signals ADD and SUBTRACT, not shown) indicating a phase relationship between signals CLKIN and CLK360. State machine 510 receives control signals CTRL and provides SELECT signals that control clock multiplexers 505–508 to select appropriate clock signals CLK90, CLK180, CLK270, and CLK360. Thus, the DLL comprising elements 501–511 ensures the correct phase relationship between each signal CLK90, CLK180, CLK270, CLK360 and input clock signal CLKIN, and the clock doubler circuit is accurate over a range of input clock frequencies. Clock generator 511 uses the signals CLKIN, CLK90, CLK180, and CLK270, which accurately reflect the starting point, one-quarter, one-half, and three-quarter points of the input clock cycle, to generate successive edges of output clock signal CLK2X. Thus, signal CLK2X has a 50 percent duty cycle.

As in the circuit of FIG. 4, implementing the circuit of FIG. 5 requires a large amount of circuitry. The circuit can be reduced in size by using a PLL. However, PLLs are very process-dependent, as described in the background section above, and digital solutions are often preferred.

Figure 6:
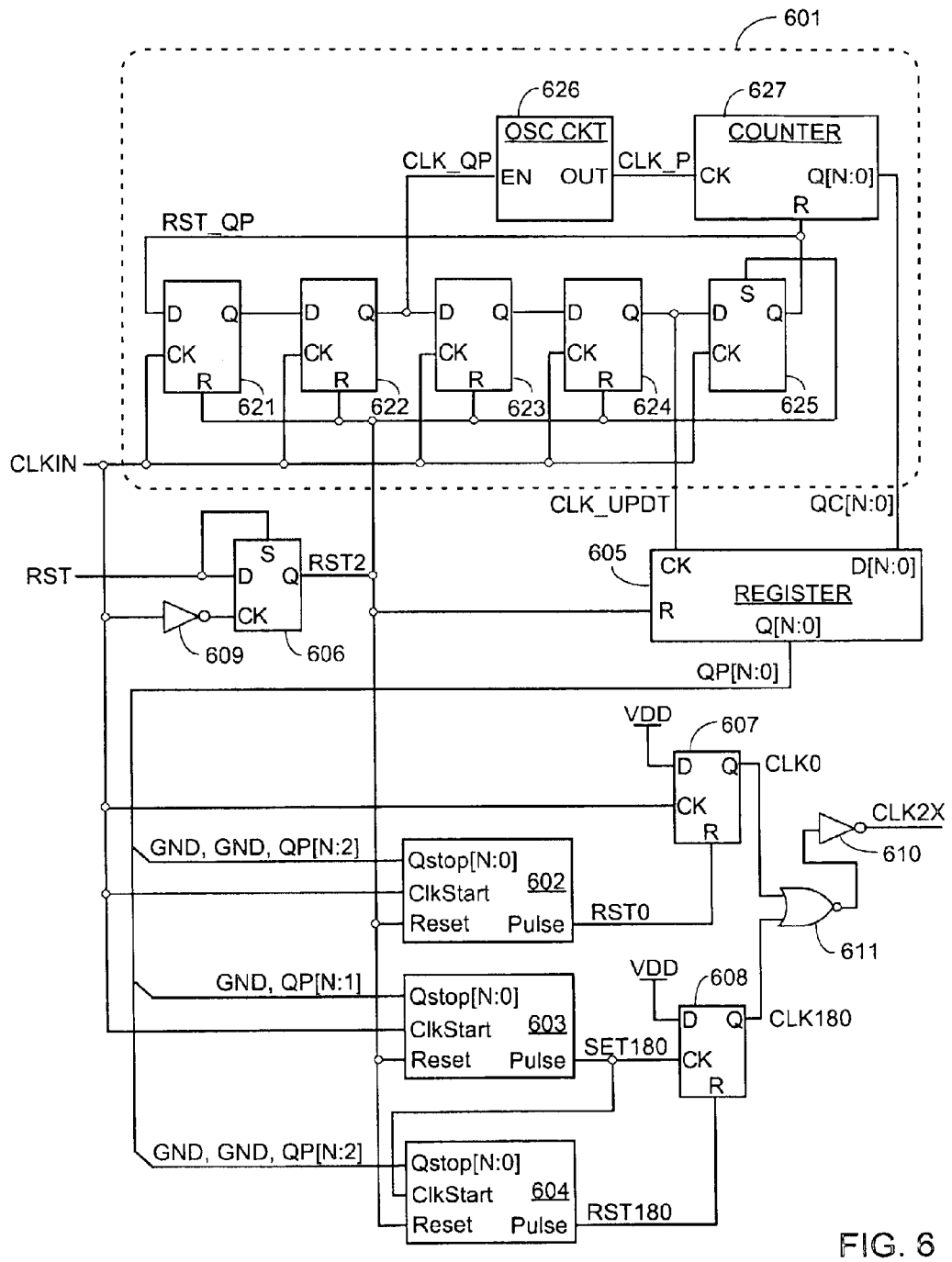
FIG. 6 is a schematic diagram of a clock doubler circuit according to an embodiment of the invention that provides 50 percent DCC.

FIG. 6 illustrates a circuit providing the same advantages (50 percent duty cycle, wide range of input frequencies), but requiring less circuitry than the circuit of FIG. 5. The circuit of FIG. 6 is small enough, for example, to be a practical addition to user circuits implemented in programmable logic devices (PLDs) such as field programmable gate arrays (FPGAs).

Figure 7:
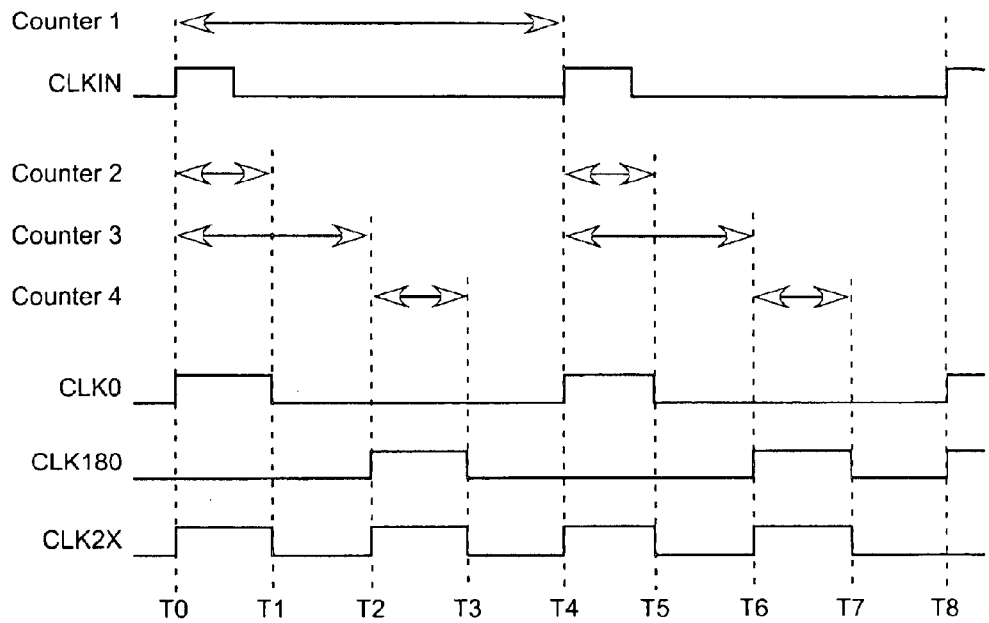
FIG. 7 is a timing diagram for the clock doubler of FIG. 6.

FIG. 6 is a schematic diagram of a clock doubler circuit according to one embodiment of the invention that includes four counters 601–604, a register 605, a reset circuit (flip-flop 606 and inverter 609), and an output clock generator (elements 607–608 and 610–611). The circuit of FIG. 6 operates as shown in FIG. 7. Thus, the combination of FIGS. 6 and 7 should be consulted in conjunction with the following explanation of the circuit of FIG. 6.

Counter 1 (601) uses a relatively faster clock signal (e.g., generated by an oscillator circuit 626) to count a number of counts P in one period of input clock signal CLKIN. The number of counts P is stored in register 605. When signal CLKIN goes high at time T0, the power high VDD value is clocked into flip-flop 607, driving signal CLK0 high and resulting in a high value on signal CLK2X. The number of counts P is recounted, in the pictured embodiment, during every fifth input clock cycle.

Counters 2, 3, and 4 (602, 603, and 604, respectively) are clocked by similar faster clock signals (e.g., generated by oscillator circuits having the same design and configuration as oscillator circuit 626). Counter 2 (602) starts counting when input clock signal CLKIN (ClkStart) goes high, and compares the count value with one-fourth of the value stored in register 605 (i.e., P/4). Note that counter 2 does not use the two least significant bits from register 605, thus dividing the value in register 605 by four to provide the counter stop value Qstop[N:0]. When the value in counter 2 reaches P/4 (at time T1 of FIG. 7), counter 2 (602) provides a high output pulse on signal RST0. The high output pulse resets flip-flop 607, driving signal CLK0 low at time T1, as shown in FIG. 7. The high output pulse also resets counter 2. Because signal CLK180 is also low, NOR gate 611 provides a high value to inverter 610, which drives output clock signal CLK2X low at time T1.

Counter 3 (603) starts counting when input clock signal CLKIN (ClkStart) goes high, and compares the count value with one-half of the value stored in register 605 (i.e., P/2). Note that counter 3 does not use the least significant bit from register 605, thus dividing the value in register 605 by two to provide the counter stop value Qstop[N:0]. When the value in counter 3 reaches P/2 (at time T2 of FIG. 7), counter 3 (603) provides a high output pulse on signal SET180. The high output pulse clocks the power high VDD value into flip-flop 608, driving signal CLK180 high at time T2, as shown in FIG. 7. The high output pulse also resets counter 3. In response, NOR gate 611 provides a low value to inverter 610, which drives output clock signal CLK2X high at time T2.

Counter 4 (604) starts counting when signal SET180 (ClkStart) goes high, and compares the count value with one-fourth of the value stored in register 605 (i.e., P/4). Note that counter 4 does not use the two least significant bits from register 605, thus dividing the value in register 605 by four to provide the counter stop value Qstop[N:0]. When the value in counter 4 reaches P/4 (at time T3 of FIG. 7), counter 4 (604) provides a high output pulse on signal RST180. The high output pulse resets flip-flop 608, driving signal CLK180 low at time T3, as shown in FIG. 7. The high output pulse also resets counter 4. Because signal CLK0 is also low, NOR gate 611 provides a high value to inverter 610, which drives output clock signal CLK2X low at time T3.

In the pictured embodiment, the reset signal for each of counters 1–4 (601–604) and register 605 is signal RST2, which is provided by flip-flop 606. Whenever a global reset signal RST is high (active), flip-flop 606 ensures that signal RST2 is also high, resetting all counters and register 605. Whenever the global reset signal RST is low (inactive), flip-flop 606 clocks in the low value and drives signal RST2 low on the next falling edge of signal CLKIN.

In the pictured embodiment, counter 1 (601) is designed to recount the length of the input clock pulse (i.e., to generate a new value of P) every fifth clock cycle. In other embodiments, the periodicity of the count has other values, e.g., the desired periodicity can be selected based on the stability of the input clock frequency. In other embodiments, other implementations of counter circuit 601 are used. Any appropriate embodiment can be used.

Counter circuit 601 has as inputs input clock signal CLKIN and reset signal RST2. Counter circuit 601 provides a clock update signal CLK_UPDT and a counter output bus QC[N:0]. In the pictured embodiment, counter circuit 601 includes a counter 627, which counts a number of counts in one period of the input clock signal CLKIN.

In the pictured embodiment, counter circuit 601 includes reset flip-flops 621–624, set flip-flop 625, oscillator circuit 626, and counter 627. Flip-flops 621–625 are coupled in series, and serve to provide three non-overlapping clock pulses in the following repeating sequence: RST_QP, CLK_QP, and CLK_UPDT. Each of these signals is high for only one clock cycle.

Initially, signal RST_QP is high, because flip-flop 625 is a set flip-flop, and counter 627 is reset. The first rising edge of signal CLKIN brings signal RST_QP low. On the second rising edge of signal CLKIN, signal CLK_QP provides a high value on oscillator enable signal EN to oscillator circuit 626. Thus, oscillator enable signal EN is high for one out of every five input clock cycles. Oscillator circuit 626 generates a relatively fast oscillator output signal OUT (i.e., faster than input clock signal CLKIN) whenever signal EN is high. The oscillator output signal CLK_P is used by counter 627 to measure the input clock period. Thus, in the pictured embodiment counter 627 performs the counting process only during one input clock period out of each five input clock periods. On the fourth rising edge of signal CLKIN, signal CLK_UPDT goes high. On the fifth rising edge of signal CLKIN, signal RST_QP goes high again, resetting counter 627. The cycle then repeats each five clock cycles.

Note that the number of flip-flops coupled in series in counter circuit 601 determines the frequency with which the length of the input clock period is determined. For example, in the embodiment of FIG. 6, the period is measured every five clock cycles. By adding another reset flip-flop to the chain (e.g., in front of set flip-flop 625), the period would be measured every six clock cycles, and so forth. It will be clear to one of skill in the relevant arts that this selection is a matter of design choice.

Figure 8:
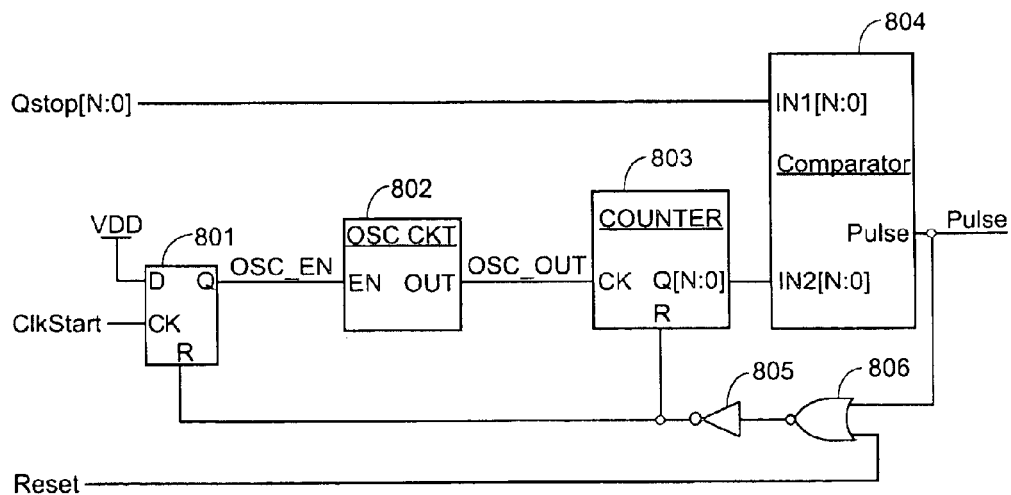
FIG. 8 is a schematic diagram of a counter circuit that can optionally be used to implement three of the counters in the embodiment of FIG. 6.

FIG. 8 is a schematic diagram of one counter embodiment that can be used to implement counters 602–604 of FIG. 6. This embodiment can be used, for example, when counter 601 is implemented as shown in FIG. 6. The counter of FIG. 8 includes a reset flip-flop 801, an oscillator circuit 802, a counter 803, a comparator 804, a NOR gate 806, and an inverter 805. When signal ClkStart goes high, the power high VDD value is clocked into flip-flop 801, driving flip-flop output signal OSC_EN high and enabling oscillator 802. Oscillator 802 provides an output signal OSC_OUT having a frequency relatively much higher than that of input clock signal CLKIN. Counter 803 is clocked by oscillator 802, and thus counts the oscillations on signal OSC_OUT. The value stored in counter 803 is passed to comparator 804, where it is compared to the value Qstop[N:0]. When the values match, signal PULSE goes high, resetting flip-flop 801 and counter 803 via NOR gate 806 and inverter 805. Signal Reset can also reset flip-flop 801 and counter 803 via NOR gate 806 and inverter 805.

Any known oscillator circuit can be used to implement oscillator circuit 802 of FIG. 8 and oscillator circuit 626 of FIG. 6. Preferably, the same implementation is used for all four oscillator circuits in the clock doubler, as this approach creates a high correlation between the four oscillators irregardless of external factors such as processing and temperature variations. For example, the well known ring oscillator design (e.g., a loop including an odd number of logic gates, e.g., two inverters and a NAND gate driven by the enable signal) can be used. This embodiment is particularly useful when the clock doubler circuit is implemented in a PLD, because the oscillator can be implemented using the programmable logic blocks of the PLD. In some embodiments, external oscillators are used.

Any known counter or counters can be used to implement counter 803 of FIG. 8 and/or counter 627 of FIG. 6. For example, the well known ripple counters can be used. In some embodiments, double-edge flip-flops are used to double the count stored in the counter. In some embodiments, a first subset of the counters use double-edge flip-flops with a first oscillator frequency, while a second subset of the counters use single-edge flip-flops with a second oscillator frequency twice that of the first oscillator frequency.

Any known comparator can be used to implement comparator 804 of FIG. 8. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signal in FIG. 8.

Figure 9:
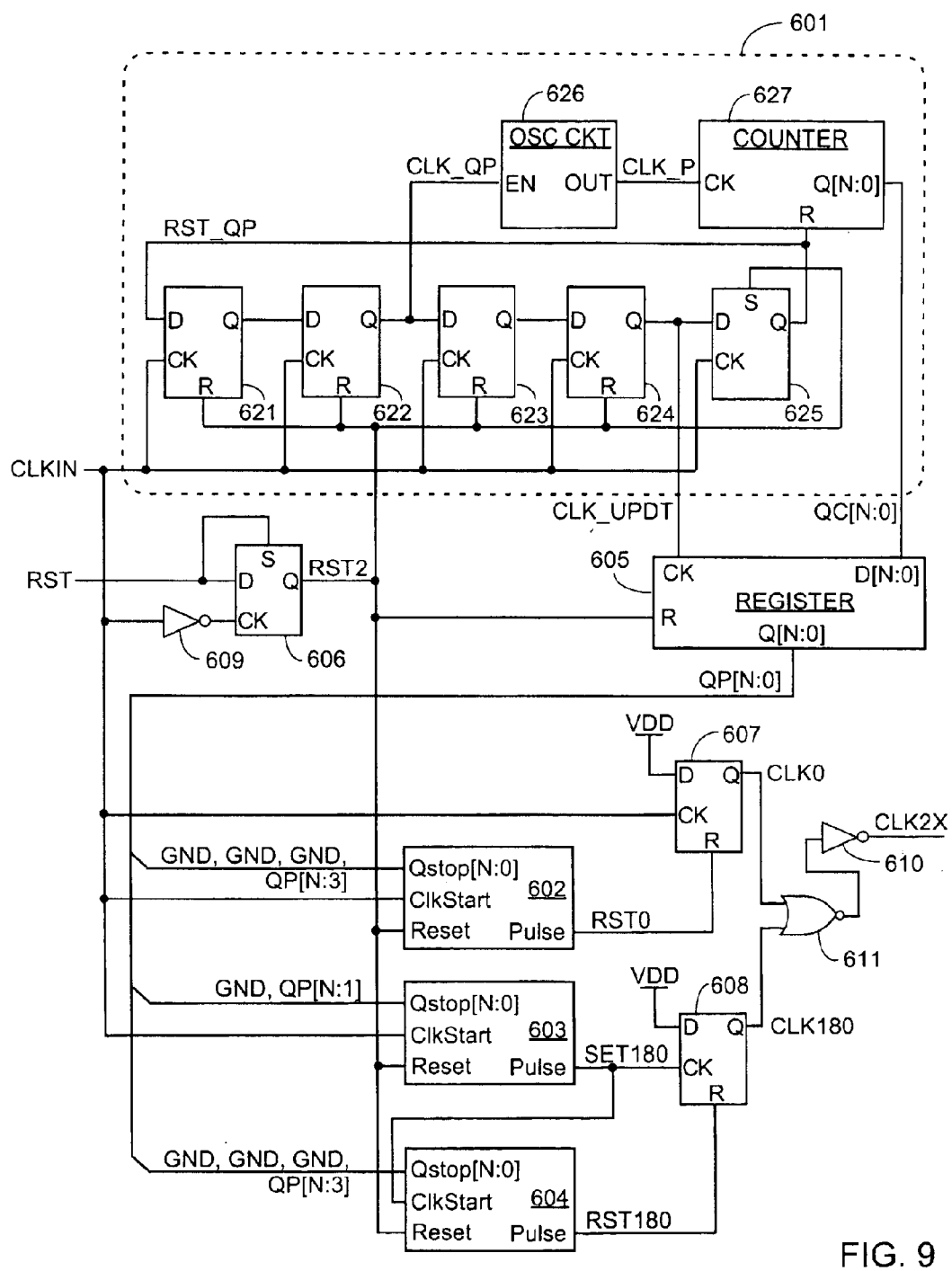
FIG. 9 is a schematic diagram of a clock doubler circuit according to an embodiment of the invention that provides 25 percent DCC.
Figure 10:
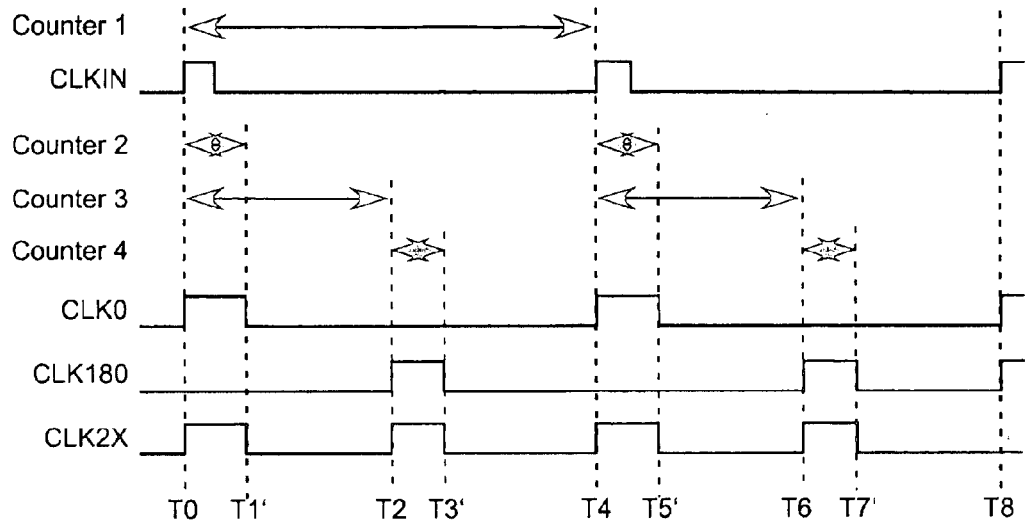
FIG. 10 is a timing diagram for the clock doubler circuit of FIG. 9.

FIG. 9 is a schematic diagram of a clock doubler circuit according to another embodiment of the invention that provides 25 percent DCC. The embodiment of FIG. 9 is similar to that of FIG. 6, but counters 2–4 (counters 602–604) are provided with different stop values, altering the positions of the output clock edges. Note that the elements of FIG. 9 are similar to those of FIG. 6, and are similarly interconnected, except as is now described. FIG. 10 is a timing diagram for the clock doubler circuit of FIG. 9.

Counter 1 (601) uses a relatively faster clock signal (e.g., generated by oscillator circuit 626) to count a number of counts P in one period of input clock signal CLKIN. The number of counts P is stored in register 605. When signal CLKIN goes high at time T0, the power high VDD value is clocked into flip-flop 607, driving signal CLK0 high and resulting in a high value on signal CLK2X. The number of counts P is recounted, in the pictured embodiment, during every fifth clock cycle.

Counters 2, 3, and 4 (602–604) are clocked by similar faster clock signals (e.g., generated by oscillator circuits having the same design and configuration as oscillator circuit 626). Counter 2 (602) starts counting when input clock signal CLKIN (ClkStart) goes high, and compares the count value with one-eighth of the value stored in register 605 (i.e., P/8). Note that counter 2 does not use the three least significant bits from register 605, thus dividing the value in register 605 by eight to provide the counter stop value Qstop[N:0]. When the value in counter 2 reaches P/8 (at time T1' of FIG. 10), counter 2 (602) provides a high output pulse on signal RST0. The high output pulse resets flip-flop 607, driving signal CLK0 low at time T1', as shown in FIG. 10. The high output pulse also resets counter 2. Because signal CLK180 is also low, NOR gate 611 provides a high value to inverter 610, which drives output clock signal CLK2X low at time T1'.

Counter 3 (603) functions in the same fashion as in the embodiment of FIG. 6, driving output clock signal CLK2X high at time T2.

Counter 4 (604) starts counting when signal SET180 (ClkStart) goes high, and compares the count value with one-eighth of the value stored in register 605 (i.e., P/8). Note that counter 4 does not use the three least significant bits from register 605, thus dividing the value in register 605 by eight to provide the counter stop value Qstop[N:0]. When the value in the counter reaches P/8 (at time T3' of FIG. 10), counter 4 (604) provides a high output pulse on signal RST180. The high output pulse resets flip-flop 608, driving signal CLK180 low at time T3', as shown in FIG. 7. The high output pulse also resets counter 4. Because signal CLK0 is also low, NOR gate 611 provides a high value to inverter 610, which drives output clock signal CLK2X low at time T3'.

Figure 12:
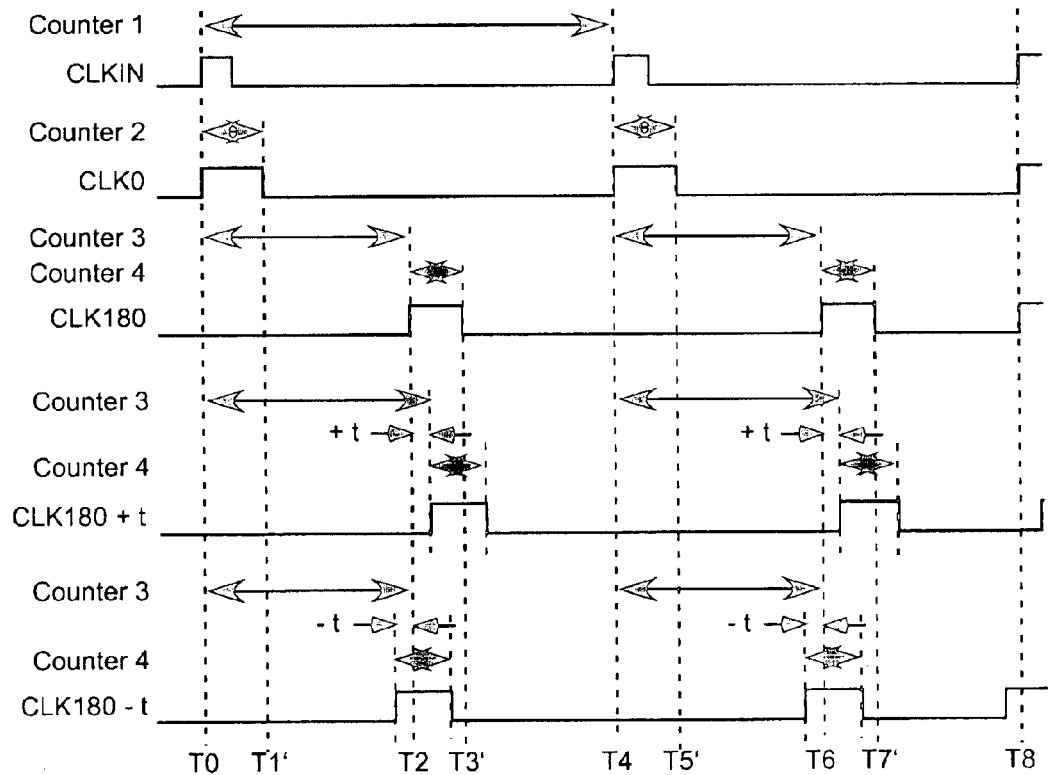
FIG. 12 is a timing diagram for the clock doubler circuit of FIG. 11.
Figure 11:
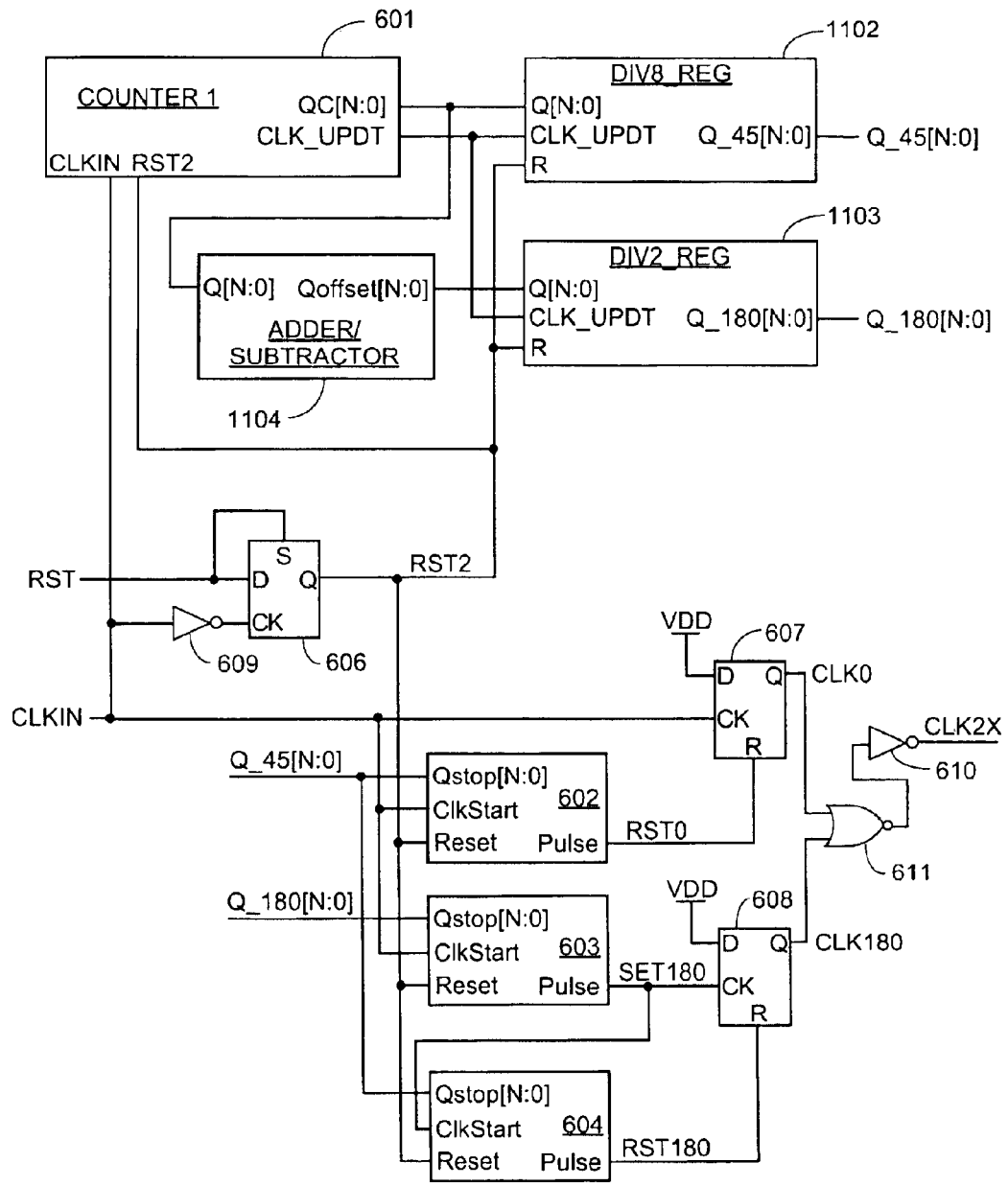
FIG. 11 is a schematic diagram of a clock doubler circuit according to an embodiment of the invention that provides 25 percent DCC and a predetermined offset.

The embodiment of FIGS. 9 and 10 demonstrates that the clock edges of the output clock signal CLK2X can be moved by altering the stop values (Qstop[N:0]) for counters 602–604. In the embodiments of FIGS. 6–10, the stop values are obtained from the registered value by shifting the bits to divide by values of two, four, or eight, for example. FIGS. 11–12 illustrate an embodiment in which the stop values are altered in another fashion—by adding or subtracting a value from the stop values for the counters, thereby providing a predetermined offset value for alternating clock cycles.

The clock doubler circuit of FIG. 11 provides 25 percent DCC and a predetermined offset. The circuit includes four counters 601–604 (which can be similar, for example, to counters 601–604 of FIGS. 6 and 9), a divide-by-eight register 1102, a divide-by-two register 1103, a reset circuit (flip-flop 606 and inverter 609, similar to the elements of FIGS. 6 and 9), and an output clock generator (elements 607–608 and 610–611, also similar to the elements of FIGS. 6 and 9). The circuit of FIG. 11 operates as shown in FIG. 12. Thus, the combination of FIGS. 11 and 12 should be consulted in conjunction with the following explanation of the circuit of FIG. 11. Functionality similar to that of previous figures is not further described.

Counter 1 (601) functions in the same fashion as in FIGS. 6 and 9. Thus, the number of counts P is provided on output terminals QC[N:0]. The number of counts P can be recounted, for example, every fifth clock cycle.

The number of counts P is provided to divide-by-eight register 1102, where the value is divided by eight and registered. For example, the division can be performed by simply shifting the number of counts by three bits towards the least significant bit (LSB), as in the embodiments of FIGS. 6 and 9. In some embodiments, divide-by-eight register 1102 is implemented as shown in FIG. 13. From divide-by-eight register 1102, the divided value is provided to the Qstop terminals of counters 602 and 604 via signals Q_45[N:0].

The number of counts P is also provided to divide-by-two register 1103, but is first altered by adding or subtracting a value from the number of counts using adder/subtractor 1104. (In some embodiments, not shown, the number of counts is first divided and then offset by a predetermined value, rather than performing the offset prior to the division as in the pictured embodiment.) The offset divided value Qoffset[N:0] is divided by two (e.g., by shifting by one bit towards the LSB) and stored. One embodiment of divide-by-two register 1103 is shown in FIG. 14. The divided and offset value is provided to counter 3 (603) as the stop value Qstop[N:0] via signals Q_180[N:0]. Adder/subtractors are well known in the relevant arts, and any suitable implementation can be used.

As in previously described embodiments, counters 2, 3, and 4 (602, 603, and 604) are clocked by similar faster clock signals (e.g., generated by oscillator circuits having the same design and configuration as oscillator circuit 626). Counter 2 (602) starts counting when input clock signal CLKIN (ClkStart) goes high, and compares the count value with the value stored in divide-by-eight register 1102 (i.e., one-eighth of the value stored in register 605, or P/8). When the value in the counter reaches P/8 (at time T1' of FIG. 12), counter 2 (602) provides a high output pulse on signal RST0. The high output pulse resets flip-flop 607, driving signal CLK0 low at time T1', as shown in FIG. 12. The high output pulse also resets counter 2. Because signal CLK180 is also low, NOR gate 611 provides a high value to inverter 610, which drives output clock signal CLK2X low at time T1'.

Counter 3 (603) starts counting when input clock signal CLKIN (ClkStart) goes high, and compares the count value with the value stored in divide-by-two register 1103. Thus, the count value is compared to one-half of the count value P (i.e., P/2) plus or minus a predetermined offset. When the value in the counter reaches this stop value, counter 3 (603) provides a high output pulse on signal SET180. The high output pulse clocks the power high VDD value into flip-flop 608, driving signal CLK180 high, as shown in FIG. 12. The high output pulse also resets counter 3. In response, NOR gate 611 provides a low value to inverter 610, which drives output clock signal CLK2X high.

FIG. 12 illustrates signal CLK180 with no offset (CLK180), signal CLK180 with a positive offset t (CLK180+t, occurring after time T2), and signal CLK180 with a negative offset t (CLK180−t, occurring prior to time T2).

Counter 4 (604) starts counting when signal SET180 (ClkStart) goes high, and compares the count value with the value stored in divide-by-eight register 1102 (i.e., one-eighth of the count value P, or P/8). When the value in the counter reaches P/8, counter 4 (604) provides a high output pulse on signal RST180. The high output pulse resets flip-flop 608, driving signal CLK180 low, as shown in FIG. 12. The high output pulse also resets counter 4. Because signal CLK0 is also low, NOR gate 611 provides a high value to inverter 610, which drives output clock signal CLK2X low. As shown in FIG. 12, because the output pulse from counter 4 is counted from an offset value (the offset rising edge), the falling edge of the output pulse is also offset.

FIG. 13 is a schematic diagram of divide-by-eight register 1102 that can optionally be used in the embodiment of FIG. 11. In the pictured embodiment, the registers and counters each include N+1 bits, where N is seven. In other embodiments, the number of bits varies. For example, in the embodiment of FIGS. 11–14, if counter 1 provides an 8-bit value, counters 2 and 4 can be only 5 bits wide, while counter 3 is 7 bits wide. However, this type of simplification will be clear to those of skill in the relevant arts. Therefore, the simpler approach of consistent bit width is used in the diagrams herein, for clarity.

The register of FIG. 13 includes five reset flip-flops 1301–1305 coupled to receive signals Q[3:7], respectively, and to provide signals Q_45[0:4], respectively. The shift by three bits towards the LSB performs the divide-by-eight function. The three upper bits Q_45[5:7] are in this embodiment provided by a ground signal GND through inverters 1311–1312, 1313–1314, and 1315–1316, respectively. In other embodiments, inverters 1311–1316 are omitted. In yet other embodiments, the output bus provided by register 1102 is narrower than the output bus from counter 601 (i.e., the upper bits of bus Q_45 are omitted), and one or both of counters 602 and 604 include fewer bits than counter 601.

FIG. 14 is a schematic diagram of divide-by-two register 1103 that can optionally be used in the embodiment of FIG. 11. The register of FIG. 14 includes seven reset flip-flops 1401–1407 coupled to receive signals Q[1:7], respectively, and to provide signals Q_180[0:6], respectively. The shift by one bit towards the LSB performs the divide-by-two function. The upper bit Q_180[7] is in this embodiment provided by a ground signal GND through inverters 1411–1412, respectively. In other embodiments, inverters 1411–1412 are omitted. In yet other embodiments, the output bus provided by register 1103 is narrower than the output bus from counter 601 (i.e., the most significant bit of bus Q_180 is omitted), and counter 603 includes one fewer bit than counter 601.

Figure 15:
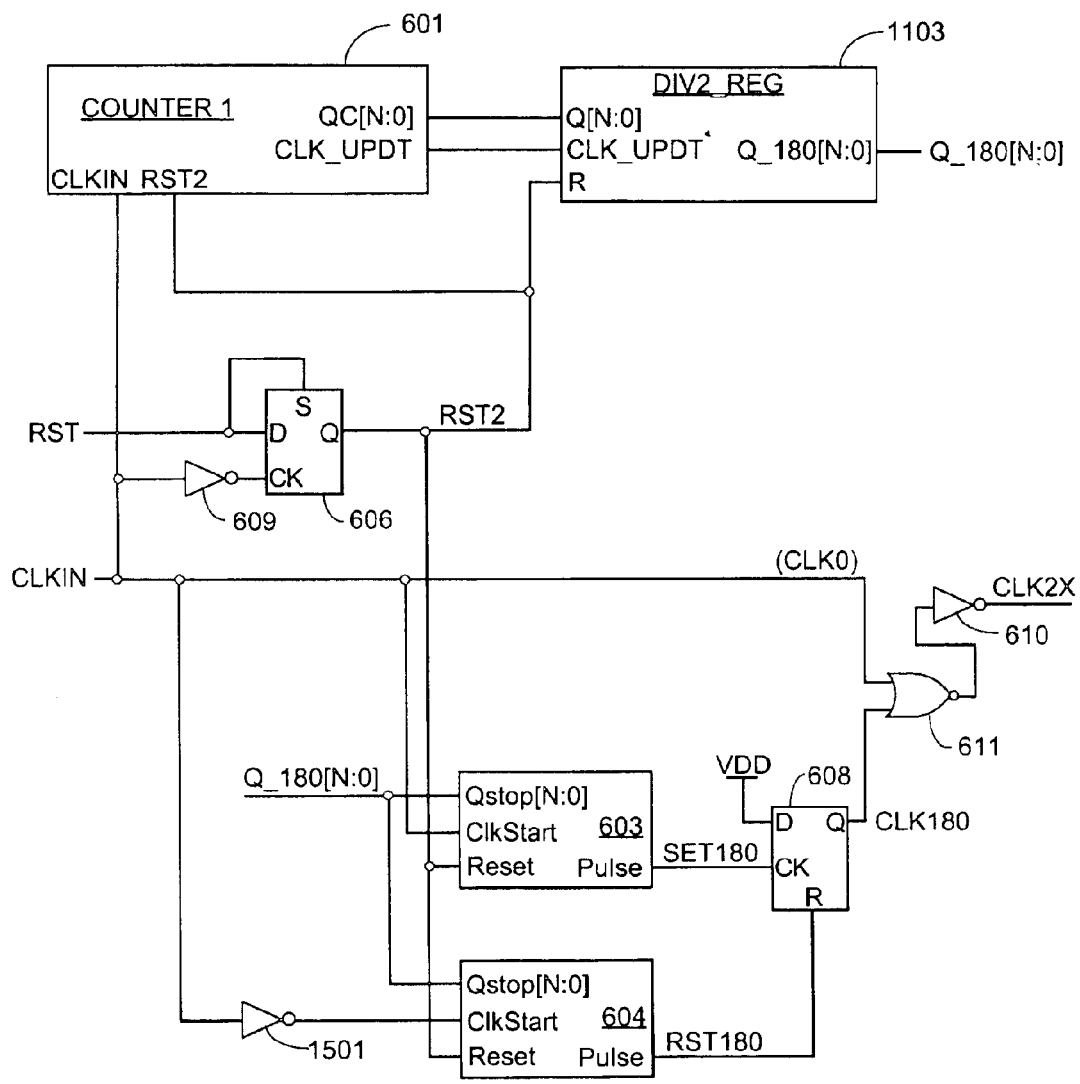
FIG. 15 is a schematic diagram of a clock doubler circuit according to an embodiment of the invention that does not provide DCC, and which passes the input clock signal to the output clock terminal when a reset signal is active.

FIG. 15 is a schematic diagram of a clock doubler circuit according to another embodiment of the invention. The clock doubler circuit of FIG. 15 does not provide DCC. Functionality the same as that of previous embodiments is not further described.

The circuit of FIG. 15 includes three counters 601 and 603–604 (which can be similar, for example, to counters 601 and 603–604 of FIGS. 6, 9, and 11), a divide-by-two register 1103 (which can be similar, for example, to register 1103 of FIG. 11), a reset circuit (flip-flop 606 and inverter 609, similar to the elements of FIGS. 6, 9, and 11), an output clock generator (elements 608 and 610–611), and inverter 1501. The circuit of FIG. 15 does not include an equivalent counter to counter 2 of FIGS. 6, 9, and 11.

Counter 1 (601) functions in the same fashion as in FIGS. 6, 9, and 11. Thus, the number of counts P is provided on output terminals QC[N:0]. The number of counts P can be recounted, for example, every fifth clock cycle. The number of counts P is provided to divide-by-two register 1103, where the value is divided by two (e.g., by shifting by one bit towards the LSB) and stored.

When signal CLKIN pulses high, the high pulse is echoed on output terminal CLK2X (via NOR gate 611 and inverter 610). To provide the clock doubler function, a second clock pulse must be generated halfway through the input clock cycle.

Counter 3 (603) starts counting when input clock signal CLKIN (ClkStart) goes high, and compares the count value with the value stored in divide-by-two register 1103. Thus, the count value is compared to one-half of the count value P (i.e., P/2). When the value in counter 3 reaches this stop value, counter 3 (603) provides a high output pulse on signal SET180. The high output pulse clocks the power high VDD value into flip-flop 608, driving signal CLK180 high. The high output pulse also resets counter 3. In response, NOR gate 611 provides a low value to inverter 610, which drives output clock signal CLK2X high.

Counter 4 (604) starts counting when input clock signal CLKIN goes low (signal CLKIN inverted by inverter 1501 provides signal ClkStart), and compares the count value with the value stored in divide-by-two register 1103. Thus, the count value is compared to one-half of the count value P (i.e., P/2). When the value in counter 4 reaches this stop value, counter 4 (604) provides a high output pulse on signal RST180. The high output pulse resets flip-flop 608, driving signal CLK180 low. The high output pulse also resets counter 4. Because signal CLK0 is also low, NOR gate 611 provides a high value to inverter 610, which drives output clock signal CLK2X low.

Thus, each of counters 3 and 4 (603 and 604) provides a clock edge having the same polarity as signal CLKIN, but delayed from signal CLKIN by one-half a CLKIN clock period. Thus, the clock doubler of FIG. 15 does not provide DCC.

Note that in the pictured embodiment, when signal RST is high (active), signal RST2 is high, signal RST180 is high (because the two values being compared are both low, see FIG. 8), and signal CLK180 is low. Thus, output signal CLK2X is the same as input signal CLKIN.

Figure 16:
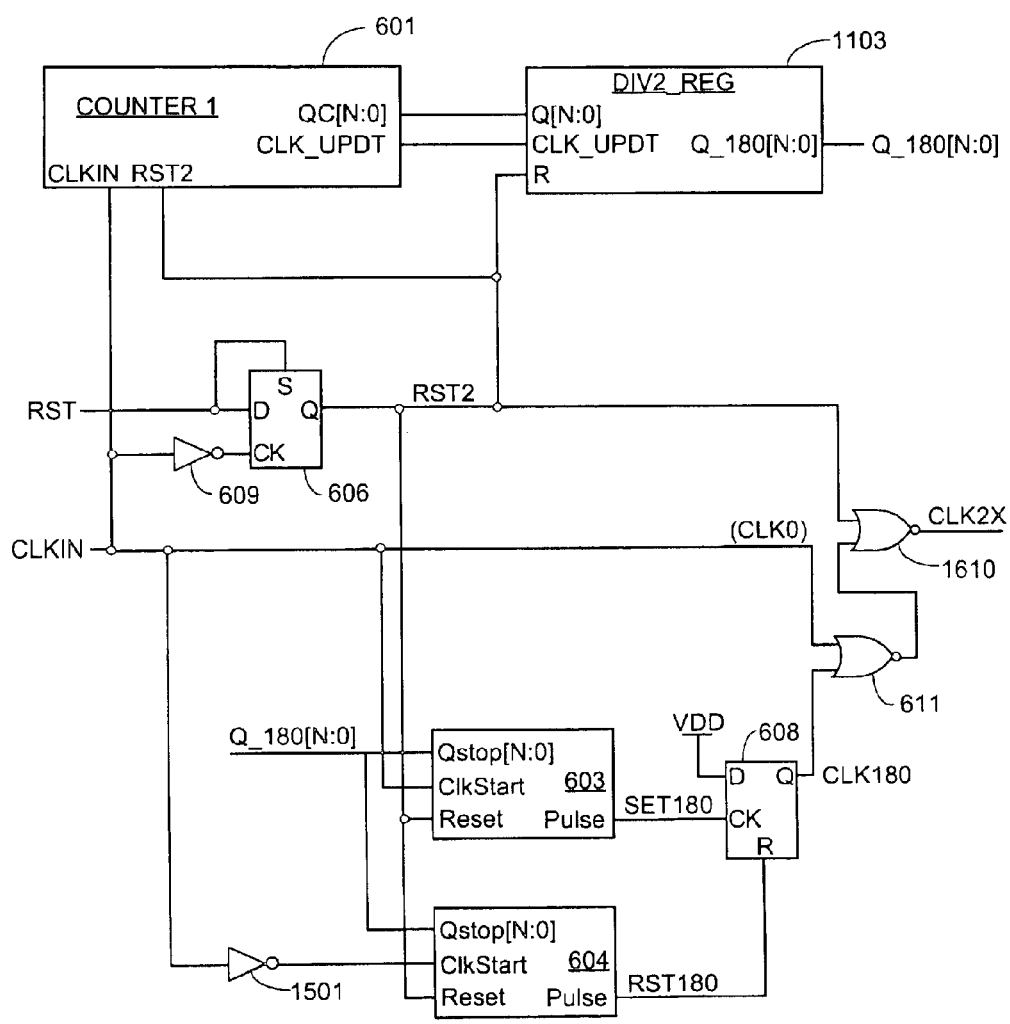
FIG. 16 is a schematic diagram of a clock doubler circuit according to an embodiment of the invention that does not provide DCC, and which provides a low value to the output clock terminal when a reset signal is active.

FIG. 16 shows a variation of the embodiment of FIG. 15 in which the output clock signal CLK2X is always low when signal RST is high. In the embodiment of FIG. 16, inverter 610 of FIG. 15 is replaced by a NOR gate 1610, driven by NOR gate 611 and by signal RST2. Thus, when signal RST goes high, signal RST2 goes high, and NOR gate 1610 drives signal CLK2X low.

Figure 17:
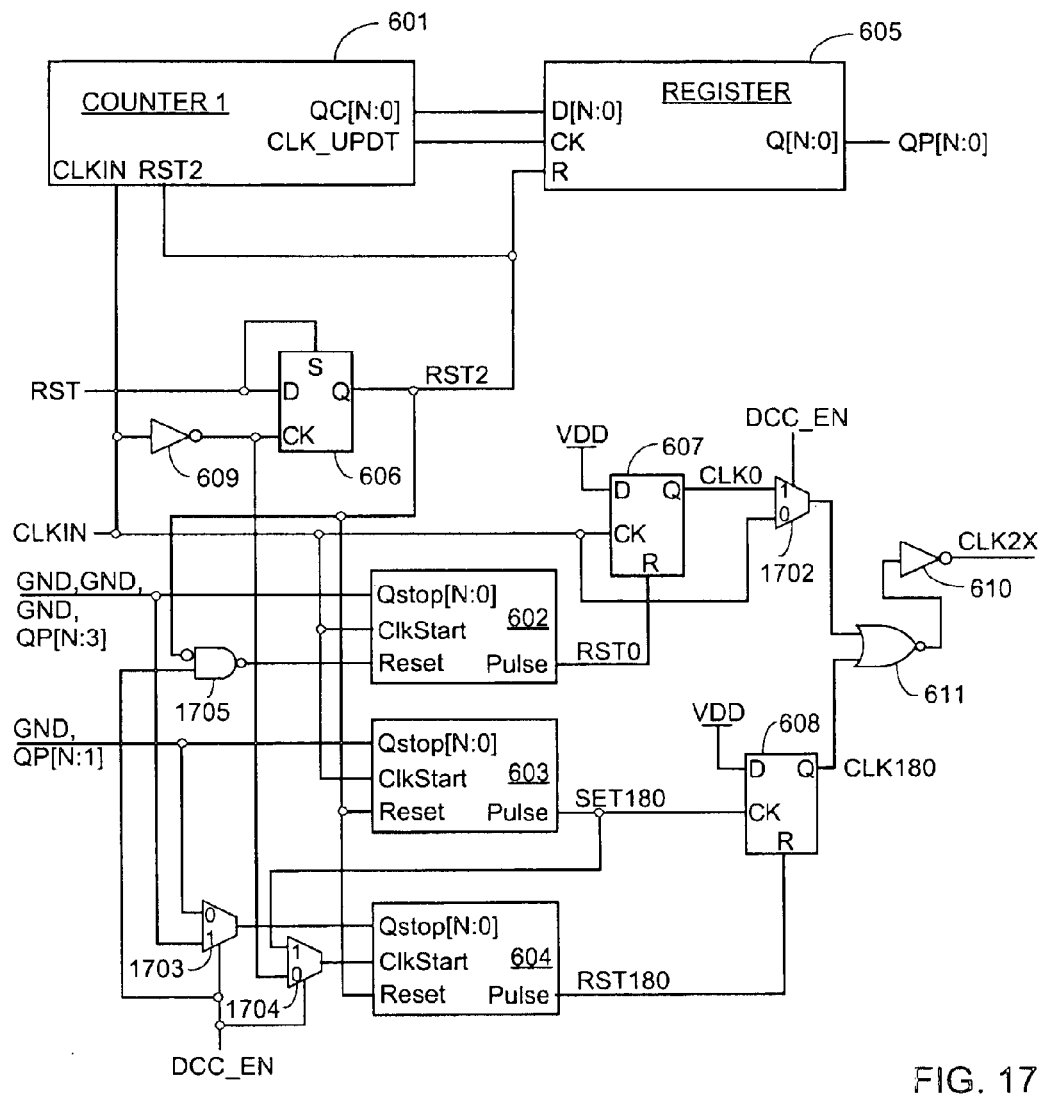
FIG. 17 is a schematic diagram of a clock doubler circuit according to an embodiment of the invention that optionally provides or does not provide DCC.

FIG. 17 is a schematic diagram of a clock doubler circuit according to an embodiment of the invention that optionally provides or does not provide DCC. The circuit of FIG. 17 is similar to the circuit of FIG. 9, with modifications that permit the optional selection of no DCC, as in FIG. 15. Only the differences from FIG. 9 are described.

In addition to the elements shown in FIG. 9, the circuit of FIG. 17 includes three multiplexers 1702–1704 and NAND gate 1705. Multiplexer 1702 is controlled by DCC enable signal DCC_EN to pass either signal CLK0 as in FIG. 9 (when signal DCC_EN is high) or signal CLKIN as in FIG. 15 (signal DCC_EN is low). Multiplexer 1703 is controlled by DCC enable signal DCC_EN to pass either signals GND, GND, GND, QP[N:3] as in FIG. 9 (when signal DCC_EN is high) or signals GND, QP[N:1], which are the equivalent signals to signals Q_180[N:0] in FIG. 15 (signal DCC_EN is low). Multiplexer 1704 is controlled by DCC enable signal DCC_EN to pass either signal SET180 as in FIG. 9 (when signal DCC_EN is high) or the inverse of signal CLKIN as in FIG. 15 (signal DCC_EN is low).

NAND gate 1705 is driven by signal DCC_EN and by the inverse of signal RST2. Thus, NAND gate 1705 controls the reset of counter 2 (602) by passing signal RST2 only when signal DCC_EN is high, i.e., when the DCC function is enabled. When signal DCC_EN is low (i.e., the DCC function is disabled), counter 2 (602) is always reset.

Figure 18:
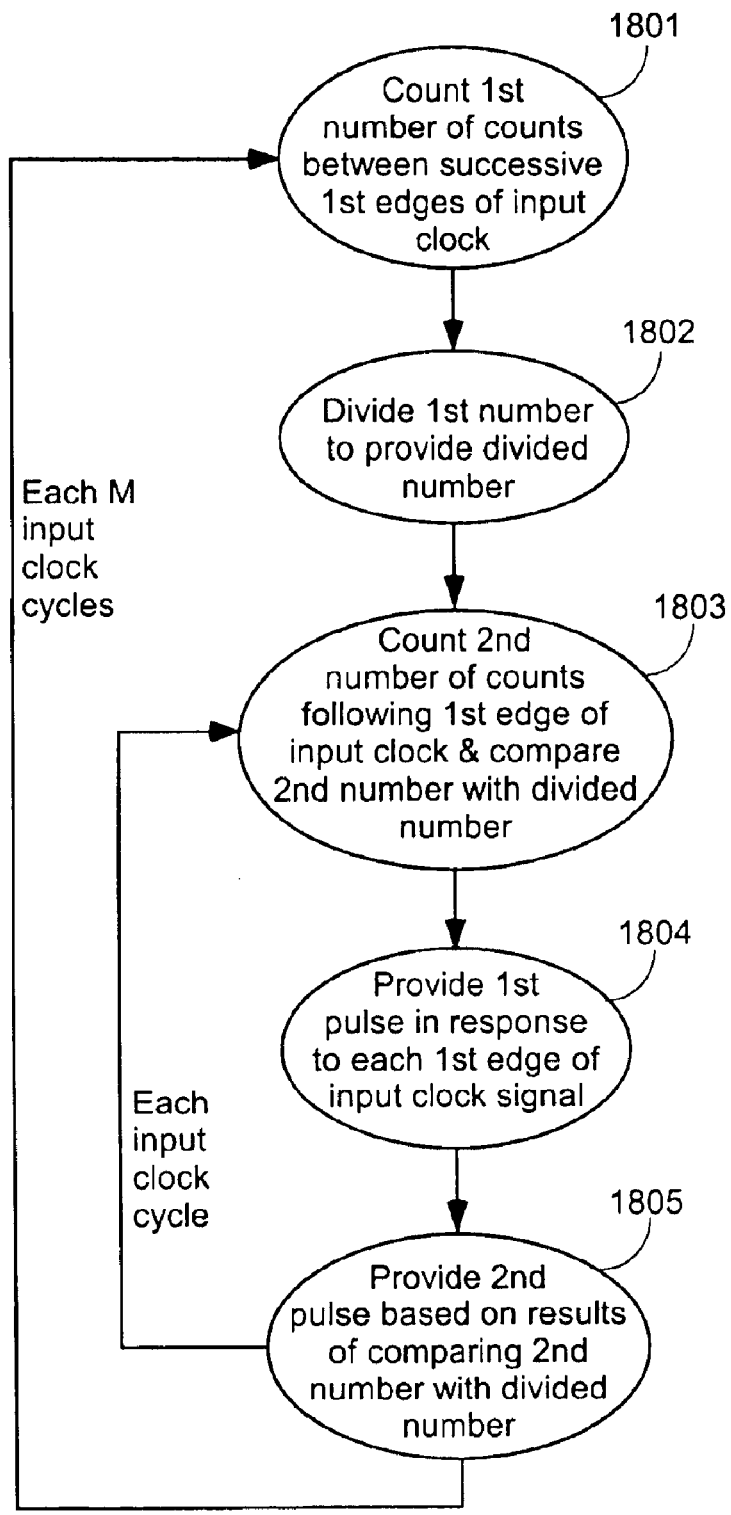
FIG. 18 illustrates the steps of a novel method of providing from an input clock signal an output clock signal having a frequency twice that of the input clock signal, according to another embodiment of the invention.

FIG. 18 illustrates the steps of a novel method of providing from an input clock signal an output clock signal having a frequency twice that of the input clock signal, according to another embodiment of the invention. The steps of FIG. 18 can be performed, for example, using any of the circuits illustrated in FIGS. 6–23. In some embodiments, the steps of FIG. 18 are performed by a circuit implemented in a programmable logic device (PLD), for example in a field programmable gate array (FPGA).

In step 1801, a first number of counts between successive first edges of an input clock signal is counted. For example, in the embodiment of FIG. 15, counter 1 (601) counts a number P of oscillator clock cycles within a single period of input clock signal CLKIN. In some embodiments, the first edges are rising edges.

In step 1802, the first number is divided to provide a divided number. In some embodiments, the number is stored, then is divided as it is passed to another circuit (e.g., as in the embodiments of FIGS. 6 and 9). In other embodiments, the number is divided prior to being stored in a register, as in the embodiments of FIGS. 11, 15, 16, and 19. In some embodiments, the number is divided by a factor of two. In other embodiments, divisors other than two are used.

In step 1803, a second number of counts following each first edge of the input clock are counted, and the second number is compared with the divided number.

In step 1804, a first pulse is provided on an output clock signal in response to each first edge of the input clock signal.

In step 1805, a second pulse is provided on the output clock signal based on the results of comparing the second number with the divided number. In some embodiments, the second pulse is provided whenever the second number is the same as the divided number. In some embodiments, the second pulse is provided whenever the second number is the same as the divided number plus an offset value. In some embodiments, the second pulse is provided whenever the second number is the same as the divided number minus an offset value.

In some embodiments, the first number of counts is repeated every M periods of the input clock signal, where M is an integer. In some embodiments, M is five.

In some embodiments, the output clock signal has a predefined duty cycle independent of a duty cycle of the input clock signal. For example, the duty cycle of the output clock signal can be 50 percent, 25 percent, or some other desired value.

Figure 19:
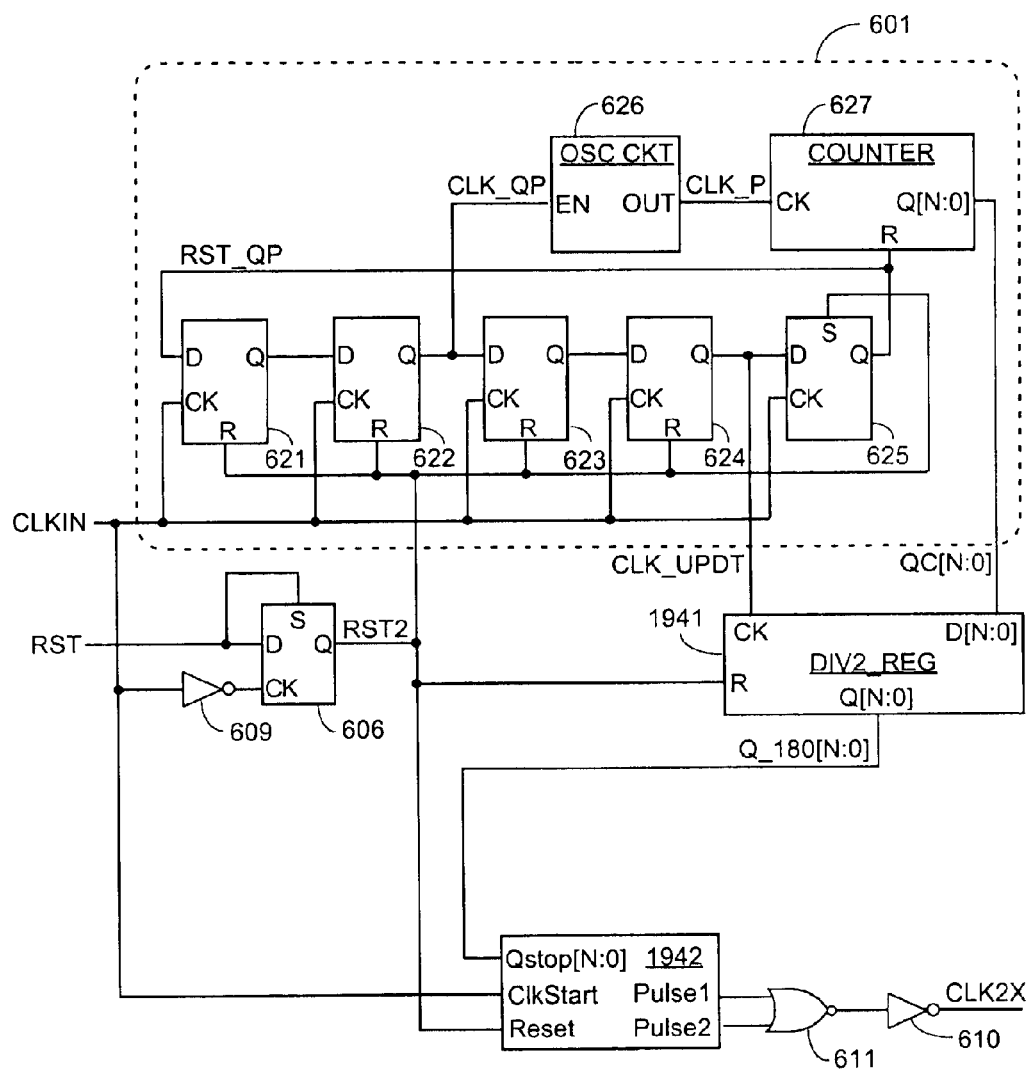
FIG. 19 is a schematic diagram of a clock doubler circuit according to an embodiment of the invention that does not provide DCC, but includes only two counter circuits.
Figure 20:
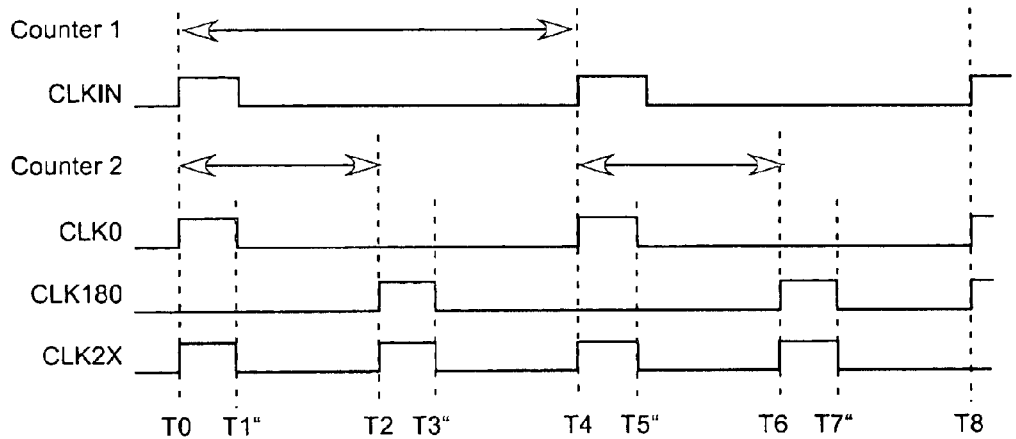
FIG. 20 is a timing diagram for the clock doubler circuit of FIG. 19.

FIG. 19 is a schematic diagram of a clock doubler circuit according to an embodiment of the invention that does not provide DCC, but includes only two counter circuits. This embodiment is particularly useful when resources and/or space are limited, e.g., when a small PLD is used to implement the circuit. The embodiment of FIG. 19 is similar in some respects to that of FIG. 6, and only the differences from that figure are described here. FIG. 20 is a timing diagram for the clock doubler circuit of FIG. 19.

Counter 1 (601) uses a relatively faster clock signal (e.g., generated by oscillator circuit 626) to count a first number of counts P in one period of input clock signal CLKIN. The first number of counts P is divided by two and stored in divide-by-two register 1941. Divide-by-two register 1941 can be implemented, for example, as shown in FIG. 14. Counter circuit 1942 is clocked by a similar faster clock signal (e.g., generated by oscillator circuits having the same design and configuration as oscillator circuit 626). The number of counts P is recounted, in the pictured embodiment, during every fifth clock cycle.

When signal CLKIN goes high at time T0, the second counter circuit 1942 begins to count and to compare the resulting second number of counts with two different values. The first value is 00 . . . 01 (all zeros with a one in the least significant bit). The second value is Q_180[N:0], the value from divide-by-two register 1941. Almost immediately (i.e., after one oscillator clock cycle), the second number is equal to 00 . . . 01, and counter circuit 1942 provides a high pulse on signal Pulse1. This pulse passes through NOR gate 611 and inverter 610 to provide a high pulse on output clock signal CLK2X from essentially time T0 (time T0 plus one oscillator clock period) to time T1".

Halfway through the input clock cycle (at time T2), counter circuit 1942 detects that the second number is equal to Q_180[N:0], the value from divide-by-two register 1941. In response, counter circuit 1942 provides a high pulse on signal Pulse2. This pulse passes through NOR gate 611 and inverter 610 to provide a high pulse on output clock signal CLK2X from time T2 to time T3".

Figure 21:
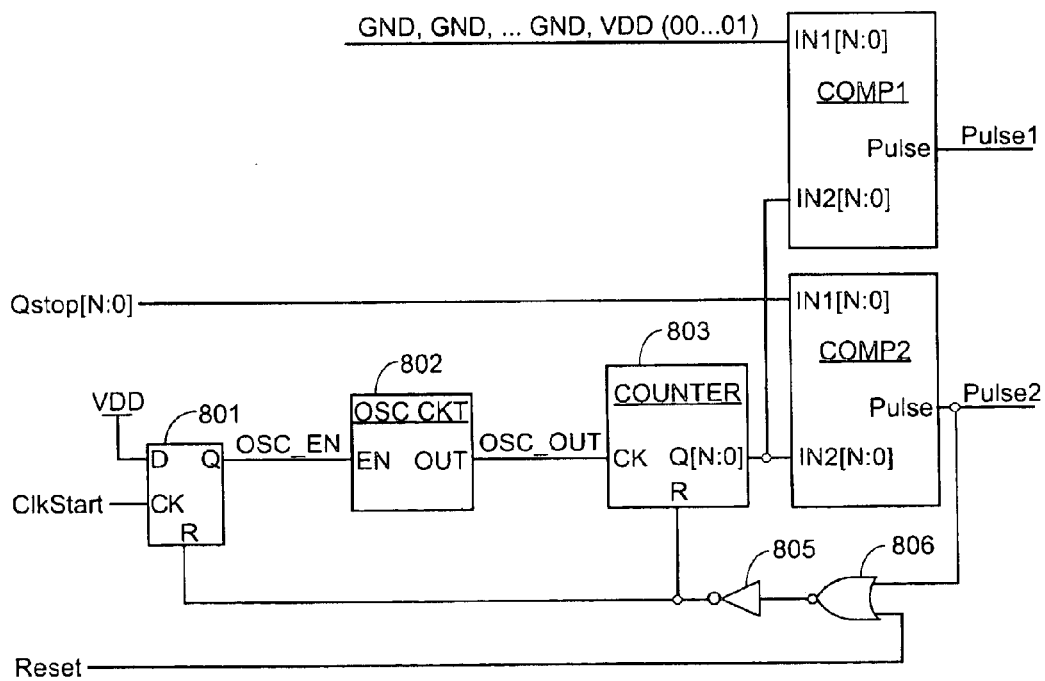
FIG. 21 illustrates a first implementation of the second counter circuit in the embodiment of FIG. 19.

FIG. 21 illustrates a first exemplary implementation of counter circuit 1942 of FIG. 19. The circuit of FIG. 21 is similar in some respects to that of FIG. 8, and only the differences from that figure are described here. The circuit of FIG. 21 includes two comparators COMP1 and COMP2. Comparator COMP1 performs the comparison between the value from counter 803 (the second number) and the value 00 . . . 01 (GND, GND, . . . , GND, VDD), as described above. When the two values are the same, a high pulse is provided on the output terminal Pulse1. Comparator COMP2 performs the comparison between the value from counter 803 (the second number of counts) and the value Q_180[N:0] (Qstop[N:0]), as described above. When the two values are the same, a high pulse is provided on the output terminal Pulse2. The high pulse on signal Pulse2 also resets the counter circuit.

Any known comparators can be used to implement comparators COMP1 and COMP2 of FIG. 21. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signal in FIG. 21.

Figure 22:
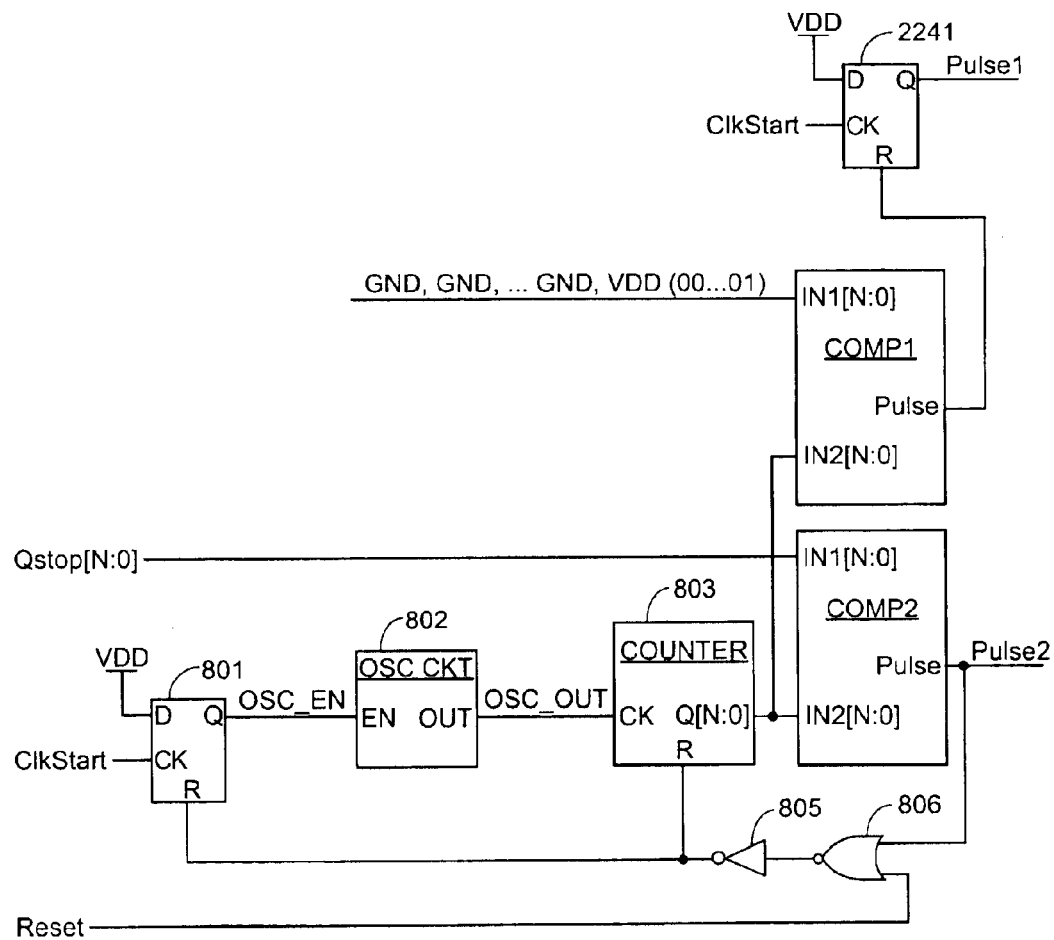
FIG. 22 illustrates a second implementation of the second counter circuit in the embodiment of FIG. 19.

FIG. 22 illustrates a second exemplary implementation of counter circuit 1942 of FIG. 19. The circuit of FIG. 22 is similar to the circuit of FIG. 21, with the addition of a flip-flop 2241. Flip-flop 2241 has a data input terminal coupled to power high VDD, an input clock terminal coupled to the input clock terminal ClkStart of the counter circuit, a reset terminal R coupled to the Pulse output terminal of comparator COMP1, and an output terminal Q coupled to the Pulse1 output terminal of the counter circuit. The addition of flip-flop 2241 removes the delay of one oscillator clock period from the first pulse at time T0.

At time T0 (see FIG. 20), signal ClkStart (CLKIN) goes high, clocking power high VDD into flip-flop 2241. Thus, signal Pulse 1 goes high at time T0. One oscillator clock period later, comparator COMP1 detects that the second number is the same as the value 00 . . . 01, and provides a high pulse on the comparator output signal Pulse. This high pulse resets flip-flop 2241, and the flip-flop output signal Pulse1 goes low again.

Figure 23:
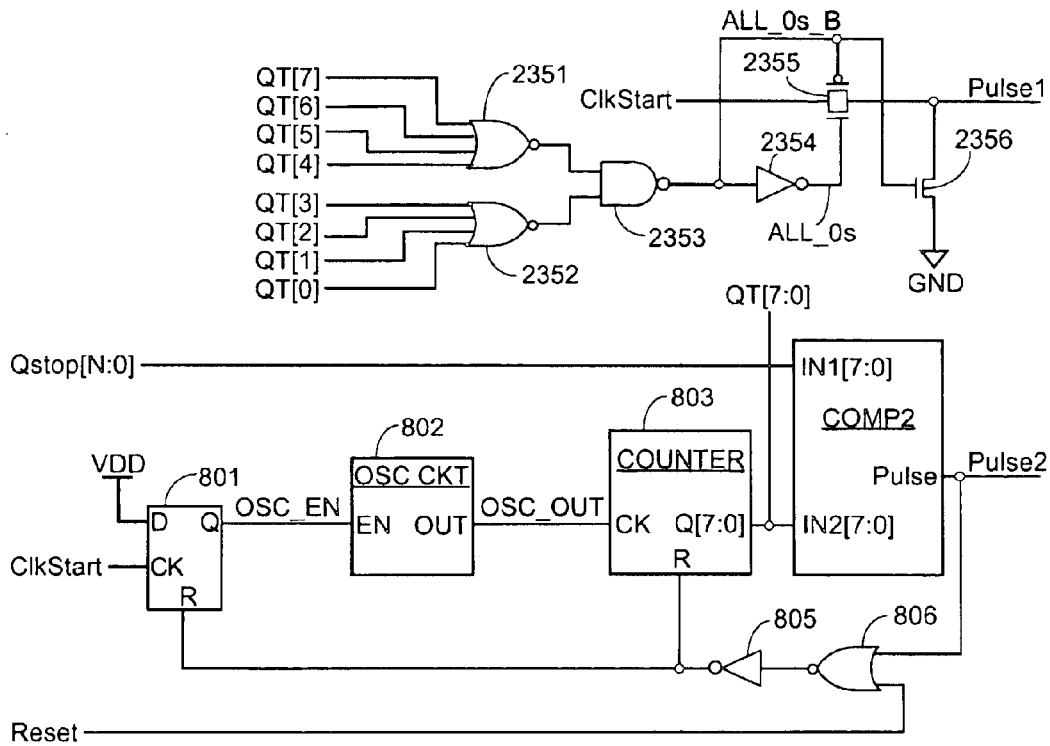
FIG. 23 illustrates a third implementation of the second counter circuit in the embodiment of FIG. 19.

FIG. 23 illustrates a third exemplary implementation of counter circuit 1942 of FIG. 19. The circuit of FIG. 23 is in some respects similar to that of FIG. 21, but comparator COMP1 is replaced by other logic that generates signal Pulse1. In the pictured embodiment, each of the counters, registers, and comparators are eight bits wide (e.g., N is seven). In the embodiment of FIG. 23, comparator COMP1 is replaced by a logical OR gate (NOR gates 2351 and 2352 plus NAND gate 2353), an inverter 2354, a pass transistor 2355, and a pull-down 2356. As in the embodiment of FIG. 22, the delay of one oscillator clock period from the first pulse at time T0 (which delay is present in the embodiment of FIG. 21) is eliminated.

Signals QT[7:4] from counter 803 drive NOR gate 2351, signals QT[3:0] from counter 803 drive NOR gate 2352, and NOR gates 2351 and 2352 drive NAND gate 2353. Thus, gates 2351–2353 implement a logical OR gate that provides a low value on signal ALL_0s_B only when all of signals QT[7:0]1 are low. Inverter 2354 inverts signal ALL_0s_B to provide a high value on signal ALL_0s when all of signals QT[7:0] are low.

At time T0 (see FIG. 20), all of signals QT[7:0] are low. Thus, signal ALL_0s_B is low, and signal ALL_0s is high. Pass transistor 2355 is enabled (turned on) and passes the high value on signal ClkStart (CLKIN) to signal Pulse1. Because signal ALL_0s_B is low, pull-down 2356 is off. The high value on signal Pulse1 passes through NOR gate 611 and inverter 610. (see FIG. 19) to provide a high pulse on output clock signal CLK2X.

Figure 23A:
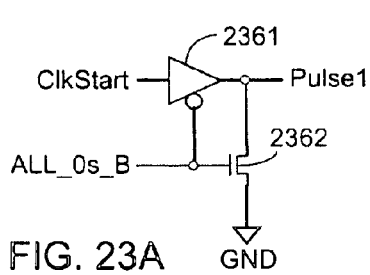
FIGS. 23A–23D provide alternative implementations of a portion of the circuit of FIG. 23.

FIGS. 23A–23D provide alternative implementations of a portion of the circuit of FIG. 23. FIG. 23A shows a first tristate buffer 2361 and pull-down 2362 that can be substituted for pass transistor 2355, pull-down 2356, and inverter 2354 of FIG. 23. Signal ClkStart (CLKIN) drives tristate buffer 2361, which has an inverted enable terminal (indicated by a bubble in FIG. 23A) driven by signal ALL_0s_B. Signal ALL_0s_B also controls pull-down 2362. When signal ALL_0s_B is low (i.e., all of signals QT[7:0] are low), tristate buffer 2361 passes signal ClkStart to the Pulse1 output terminal and pull-down 2362 is turned off.

Figure 23B:
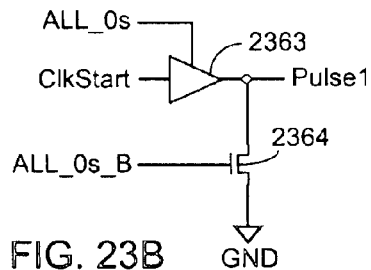

FIG. 23B shows a second tristate buffer 2363 and pull-down 2364 that can be substituted for pass transistor 2355, pull-down 2356, and inverter 2354 of FIG. 23. Signal ClkStart (CLKIN) drives tristate buffer 2363, which has an enable terminal driven by signal ALL_0s. Signal ALL_0s_B controls pull-down 2364. When all of signals QT[7:0] are low, signal ALL_0s is high and signal ALL_0s_B is low. Thus, tristate buffer 2363 passes signal ClkStart to the Pulse1 output terminal and pull-down 2364 is turned off.

Figure 23C:
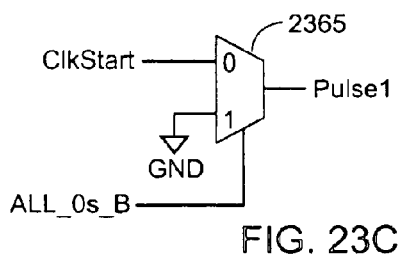

FIG. 23C shows a first multiplexer 2365 that can be substituted for pass transistor 2355, pull-down 2356, and inverter 2354 of FIG. 23. When all of signals QT[7:0] are low, signal ALL_0s_B is low, and multiplexer 2365 passes signal ClkStart to the Pulse1 output terminal. When at least one of signals QT[7:0] is high, signal ALL_0s_B is high, and multiplexer 2365 passes the ground signal GND to the Pulse1 output terminal. Thus, signal Pulse1 is only high for one oscillator clock cycle, at time T0.

Figure 23D:
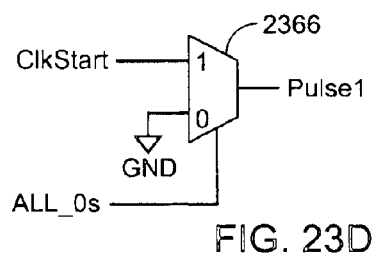

FIG. 23D shows a second multiplexer 2366 that can be substituted for pass transistor 2355, pull-down 2356, and inverter 2354 of FIG. 23. When all of signals QT[7:0] are low, signal ALL_0s is high, and multiplexer 2366 passes signal ClkStart to the Pulse1 output terminal. When at least one of signals QT[7:0] is high, signal ALL_0s is low, and multiplexer 2366 passes the ground signal GND to the Pulse1 output terminal. Thus, signal Pulse1 is only high for one oscillator clock cycle, at time T0.

Many embodiments other than those illustrated can be used to implement counter circuits 601 and 1942 of FIG. 19.

Figure 24:
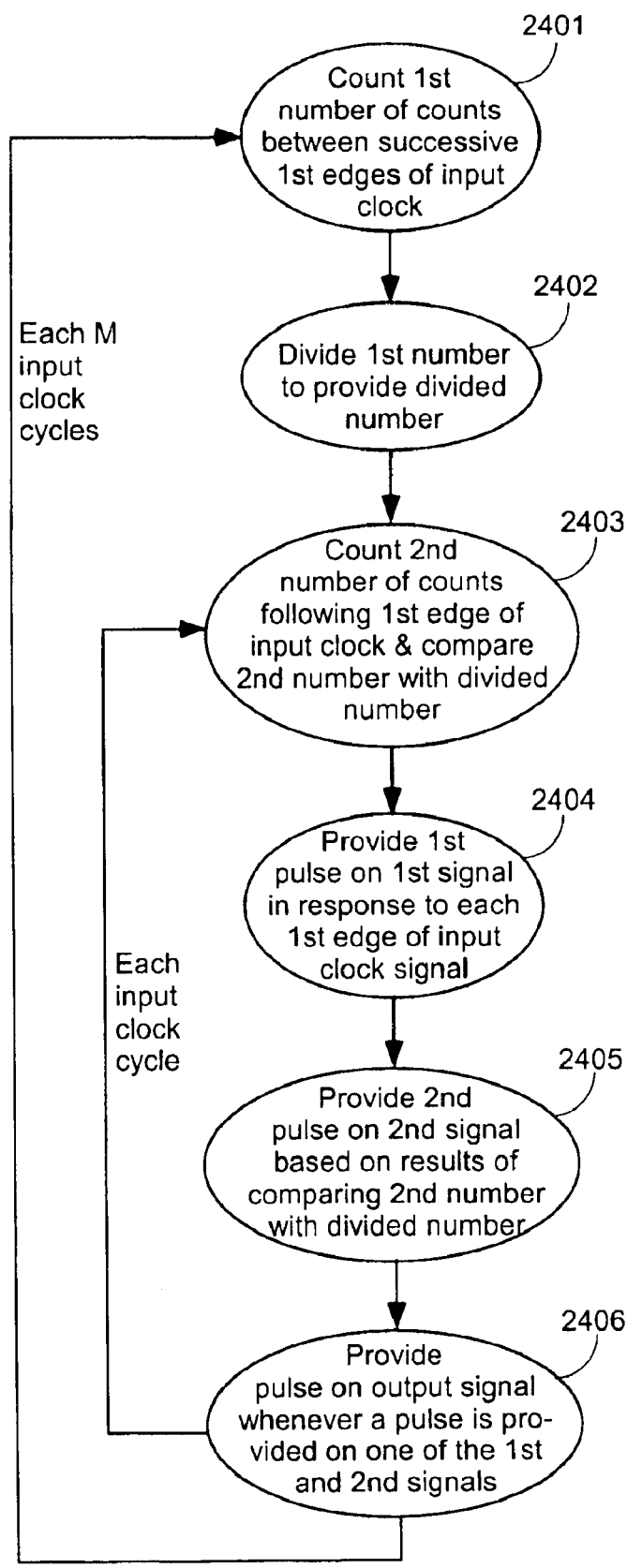
FIG. 24 illustrates the steps of a second novel method of providing from an input clock signal an output clock signal having a frequency twice that of the input clock signal, according to another embodiment of the invention.

FIG. 24 illustrates the steps of another novel method of providing from an input clock signal an output clock signal having a frequency twice that of the input clock signal, according to another embodiment of the invention. The steps of FIG. 24 can be performed, for example, using any of the circuits illustrated in FIGS. 6–23. In some embodiments, the steps of FIG. 24 are performed by a circuit implemented in a programmable logic device (PLD), for example in a field programmable gate array (FPGA).

In step 2401, a first number of counts between successive first edges of an input clock signal is counted. For example, in the embodiment of FIG. 19, counter 1 (601) counts a number P of oscillator clock cycles within a single cycle of input clock signal CLKIN. In some embodiments, the first edges are rising edges. In some embodiments, the first number has 2 to the power of K possible values, where K is an integer. In some embodiments, K is eight. In other embodiments, K is an integer larger or smaller than eight.

In step 2402, the first number is divided to provide a divided number. In some embodiments, the number is stored, then is divided as it is passed to another circuit (e.g., as in the embodiments of FIGS. 6 and 9). In other embodiments, the number is divided prior to being stored in a register, as in the embodiments of FIGS. 11, 15, 16, and 19. In some embodiments, the number is divided by a factor of two. In other embodiments, divisors other than two are used.

In step 2403, a second number of counts following each first edge of the input clock are counted, and the second number is compared with the divided number.

In step 2404, a first pulse is provided on a first signal (e.g., signal Pulse1 in FIG. 19) in response to each first edge of the input clock signal.

In step 2405, a second pulse is provided on a second signal (e.g., signal Pulse2 in FIG. 19) based on the results of comparing the second number with the divided number.

In step 2406, a pulse is provided on the output clock signal whenever a pulse is provided on one of the first and second signals.

In some embodiments, the first number of counts is counted and divided (i.e., steps 2401 and 2402 are repeated) every M periods of the input clock signal, where M is an integer. In some embodiments, M is five.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in non-programmable integrated circuits, or in printed circuit boards including discrete devices.

Further, inverters, logical OR gates, NOR gates, NAND gates, flip-flops, counters, oscillators, registers, output clock generators, reset circuits, dividers, adder/subtractors, adders, subtractors, multiplexers, comparators, pull-downs, pass transistors, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system comprising a clock doubler circuit, the clock doubler circuit comprising:
   an input clock terminal;
   an output clock terminal;
   a first counter circuit having a clock terminal coupled to the input clock terminal and a plurality of output terminals;
   a divide-by-two register having a plurality of data input terminals coupled to the output terminals of the first counter circuit, a clock terminal coupled to the input clock terminal, and a plurality of output terminals;
   a second counter circuit having a clock terminal coupled to receive a clock update signal from the first counter circuit, a plurality of data input terminals coupled to the output terminals of the divide-by-two register, and a plurality of output terminals; and
   an output clock generator having a plurality of input terminals coupled to the output terminals of the second counter circuit and an output terminal coupled to the output clock terminal of the clock doubler circuit.

2. The system of claim 1, wherein the first counter circuit comprises:
   a first oscillator circuit having an input terminal coupled to the input clock terminal and further having an output terminal; and
   a first counter having an input terminal coupled to the output terminal of the first oscillator circuit and further having a plurality of output terminals coupled to the data input terminals of the divide-by-two register.

3. The system of claim 2, wherein the second counter circuit comprises:
   a second oscillator circuit having an input terminal coupled to the input clock terminal and further having an output terminal, the second oscillator circuit being implemented to oscillate with the same frequency as the first oscillator circuit;
   a second counter having an input terminal coupled to the output terminal of the second oscillator circuit and further having a plurality of output terminals;
   a first pulse generator circuit having a first set of input terminals coupled to the output terminals of the second counter and an output terminal coupled to a first one of the input terminals of the output clock generator; and
   a second pulse generator circuit having a first set of input terminals coupled to the output terminals of the second counter, a second set of input terminals coupled to the output terminals of the divide-by-two register, and an output terminal coupled to a second one of the input terminals of the output clock generator.

4. The system of claim 3, wherein the second pulse generator circuit comprises a comparator.

5. The system of claim 3, wherein the first pulse generator circuit comprises a comparator, the first pulse generator circuit further having a second set of input terminals each of which is coupled to one of power and ground.

6. The system of claim 3, wherein the first pulse generator circuit comprises:

a logical OR gate having input terminals coupled to the output terminals of the second counter and further having an output terminal;

a pass transistor coupled between the input clock terminal and the output terminal of the first pulse generator circuit, the pass transistor having a gate terminal coupled to the output terminal of the logical OR gate; and a pull-down coupled to the output terminal of the first pulse generator circuit, the pull-down having a gate terminal coupled to the output terminal of the logical OR gate.

7. The system of claim 1, wherein the clock doubler circuit further comprises a reset input terminal coupled to reset input terminals of the first counter circuit, the divide-by-two register, and the second counter circuit.

8. The system of claim 1, wherein the clock doubler circuit further comprises:

a reset input terminal; and a flip-flop having a data input terminal coupled to the reset input terminal, a set terminal coupled to the data input terminal, a clock terminal coupled to the input clock terminal of the clock doubler circuit, and an output terminal coupled to reset input terminals of the first counter circuit, the register, and the second counter circuit.

9. The system of claim 1, wherein the first counter circuit comprises means for resetting itself after each M input clock periods, wherein M is an integer.

10. The system of claim 9, wherein M is five.

11. The system of claim 1, wherein the system comprises a programmable logic device (PLD), and the clock doubler circuit is implemented using programmable logic of the PLD.

12. The system of claim 11, wherein the PLD is a field programmable gate array (FPGA).

13. The system of claim 1, wherein the output clock generator comprises a logical OR circuit having input terminals coupled to the output terminals of the second counter circuit, and further having an output terminal coupled to the output clock terminal of the clock doubler circuit.

14. A system providing from an input clock signal an output clock signal having a frequency twice that of the input clock signal, the system comprising:

means for counting a first number of counts between successive first edges of the input clock signal;

means for dividing the first number to provide a divided number;

means for counting a second number of counts following each first edge of the input clock signal and comparing the second number with the divided number;

means for providing a first pulse on a first signal in response to each first edge of the input clock signal;

means for providing a second pulse on a second signal based on results of comparing the second number with the divided-by-two number; and means for providing a pulse on the output clock signal whenever a pulse is provided on one of the first and second signals.

15. The system of claim 14, further comprising means for repeating the counting the first number of counts and the dividing the first number to provide a divided number every M periods of the input clock signal, wherein M is an integer.

16. The system of claim 15, wherein M is five.

17. The system of claim 14, wherein the system is implemented using a programmable logic device (PLD).

18. The system of claim 17, wherein the PLD is a field programmable gate array (FPGA).

19. The system of claim 14, wherein:

the first number has 2 to the power of K possible values, K being an integer;

the divided number has 2 to the power of (K-1) possible values; and the second number has 2 to the power of (K-1) possible values.

20. The system of claim 19, wherein K is eight.

21. The system of claim 14, wherein the first edges are rising edges.

22. The system of claim 14, wherein the means for dividing the first number comprises means for dividing the first number by two.

23. A method of providing from an input clock signal an output clock signal having a frequency twice that of the input clock signal, the method comprising:

counting a first number of counts between successive first edges of the input clock signal;

dividing the first number to provide a divided number;

counting a second number of counts following each first edge of the input clock signal and comparing the second number with the divided number;

providing a first pulse on a first signal in response to each first edge of the input clock signal;

providing a second pulse on a second signal based on results of comparing the second number with the divided-by-two number; and providing a pulse on the output clock signal whenever a pulse is provided on one of the first and second signals.

24. The method of claim 23, wherein the counting the first number of counts and the dividing the first number to provide a divided number are repeated every M periods of the input clock signal, wherein M is an integer.

25. The method of claim 24, wherein M is five.

26. The method of claim 23, wherein the steps of the method are performed by a circuit implemented in a programmable logic device (PLD).

27. The method of claim 26, wherein the PLD is a field programmable gate array (FPGA).

28. The method of claim 27, wherein:

the first number has 2 to the power of K possible values, K being an integer;

the divided number has 2 to the power of (K-1) possible values; and the second number has 2 to the power of (K-1) possible values.

29. The method of claim 28, wherein K is eight.

30. The method of claim 23, wherein the first edges are rising edges.

31. The method of claim 23, wherein dividing the first number comprises dividing the first number by two.

* * * * *